US009425159B2

(12) United States Patent
Terui et al.

(10) Patent No.: US 9,425,159 B2
(45) Date of Patent: Aug. 23, 2016

(54) WIRING BOARD AND METHOD FOR MANUFACTURING THE SAME

(71) Applicant: IBIDEN CO., LTD., Ogaki-shi (JP)

(72) Inventors: Makoto Terui, Ogaki (JP); Masatoshi Kunieda, Ogaki (JP); Yoshinori Shizuno, Ogaki (JP); Asuka Ii, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 95 days.

(21) Appl. No.: 14/294,588

(22) Filed: Jun. 3, 2014

(65) Prior Publication Data
US 2014/0360767 A1 Dec. 11, 2014

(30) Foreign Application Priority Data

Jun. 5, 2013 (JP) ................................. 2013-118883

(51) Int. Cl.
*H05K 1/11* (2006.01)
*H01L 23/00* (2006.01)
*H05K 3/46* (2006.01)
*H01L 23/538* (2006.01)
*H01L 23/498* (2006.01)

(52) U.S. Cl.
CPC ........... *H01L 24/19* (2013.01); *H01L 23/5381* (2013.01); *H01L 23/5383* (2013.01); *H01L 23/5384* (2013.01); *H01L 23/5385* (2013.01); *H05K 3/4688* (2013.01); *H01L 23/49816* (2013.01); *H01L 2224/16225* (2013.01); *H01L 2224/32225* (2013.01); *H01L 2224/73204* (2013.01); *H01L 2924/12042* (2013.01); *H05K 2201/0187* (2013.01); *H05K 2201/09136* (2013.01); *H05K 2201/10159* (2013.01)

(58) Field of Classification Search
USPC .................................................. 174/260–262
See application file for complete search history.

(56) References Cited

U.S. PATENT DOCUMENTS

| 8,755,196 | B2 | 6/2014 | Ouchi et al. | |
|---|---|---|---|---|
| 8,759,691 | B2 | 6/2014 | Ouchi et al. | |
| 2006/0131611 | A1* | 6/2006 | Kaluzni | H01L 23/66 257/206 |
| 2009/0250803 | A1* | 10/2009 | Arai | H01L 21/568 257/690 |
| 2010/0081236 | A1* | 4/2010 | Yang | H01L 23/147 438/119 |

(Continued)

FOREIGN PATENT DOCUMENTS

WO WO 2007/129545 11/2007

OTHER PUBLICATIONS

U.S. Appl. No. 14/294,534, filed Jun. 3, 2014, Kunieda, et al.

(Continued)

*Primary Examiner* — Steven T Sawyer
(74) *Attorney, Agent, or Firm* — Oblon, McClelland, Maier & Neustadt, L.L.P.

(57) ABSTRACT

A wiring board includes a first insulation layer, first conductive patterns formed on the first insulation layer and including first mounting pads positioned to mount a semiconductor element, a wiring structure positioned in the first insulation layer and including a second insulation layer, second conductive patterns formed on the second insulation layer, and second mounting pads connected to the second conductive patterns, and third mounting pads formed on the first insulation layer above the second mounting pads and connected to the second mounting pads such that the third mounting pads are positioned to mount the semiconductor element and are set off from the second mounting pads toward the semiconductor element.

20 Claims, 20 Drawing Sheets

(56) References Cited

U.S. PATENT DOCUMENTS

| | | | | |
|---|---|---|---|---|
| 2011/0110061 A1* | 5/2011 | Leung | .................. | H05K 1/115 361/783 |
| 2012/0281375 A1* | 11/2012 | Hsu | .................. | H01L 23/49822 361/761 |
| 2013/0256000 A1 | 10/2013 | Terui et al. | | |
| 2013/0258625 A1 | 10/2013 | Terui et al. | | |
| 2014/0102768 A1 | 4/2014 | Shizuno et al. | | |
| 2014/0264791 A1* | 9/2014 | Manusharow | ...... | H01L 25/0655 257/666 |
| 2014/0353827 A1* | 12/2014 | Liu | ......................... | H01L 24/33 257/751 |

OTHER PUBLICATIONS

U.S. Appl. No. 14/283,337, filed May 21, 2014, Kaiya, et al.

* cited by examiner (a)

(b)

WIRING BOARD AND METHOD FOR MANUFACTURING THE SAME

CROSS-REFERENCE TO RELATED APPLICATIONS

The present application is based upon and claims the benefit of priority to Japanese Patent Application No. 2013-118883, filed Jun. 5, 2013, the entire contents of which are incorporated herein by reference.

BACKGROUND OF THE INVENTION

1. Field of the Invention

The present invention relates to a wiring board and its manufacturing method, more specifically, to a wiring board that partially has high-density wiring and to a method for manufacturing such a wiring board.

2. Description of Background Art

In recent years, IC chips have become finer and more highly integrated, and the number of mounting pads formed on the uppermost layer of a package substrate is increased. The mounting pads increases are formed at a finer pitch. For example, Published International Application WO2007/129545 describes mounting pads and a package substrate. The entire contents of this publication are incorporated herein by reference.

SUMMARY OF THE INVENTION

According to one aspect of the present invention, a wiring board includes a first insulation layer, first conductive patterns formed on the first insulation layer and including first mounting pads positioned to mount a semiconductor element, a wiring structure positioned in the first insulation layer and including a second insulation layer, second conductive patterns formed on the second insulation layer, and second mounting pads connected to the second conductive patterns, and third mounting pads formed on the first insulation layer above the second mounting pads and connected to the second mounting pads such that the third mounting pads are positioned to mount the semiconductor element and are set off from the second mounting pads toward the semiconductor element.

According to another aspect of the present invention, a method for manufacturing a wiring board includes forming a wiring structure including a second insulation layer, second conductive patterns formed on the second insulation layer, and second mounting pads connected to the second conductive patterns, accommodating the wiring structure in a first insulation layer such that the wiring structure is positioned in the first insulation layer, forming on the first insulation layer first conductive patterns including first mounting pads such that the first mounting pads are positioned to mount a semiconductor element, and forming third mounting pads on the first insulation layer above the second mounting pads such that the third mounting pads are connected to the second mounting pads and positioned to mount the semiconductor element. The forming of the third mounting pads includes setting the third mounting pads off from the second mounting pads toward the semiconductor element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1B(b) is a cross-sectional view for reference where a wiring structure is shifted toward a DRAM;

FIG. 1B(c) is a cross-sectional view for reference where a wiring structure is mounted in a base mounting position;

FIG. 8B(b) is a cross-sectional view for reference where a wiring structure is shifted toward the DRAM;

FIG. 8B(c) is a cross-sectional view for reference where a wiring structure is mounted in a base mounting position;

DETAILED DESCRIPTION OF THE EMBODIMENTS

Figure 1A:
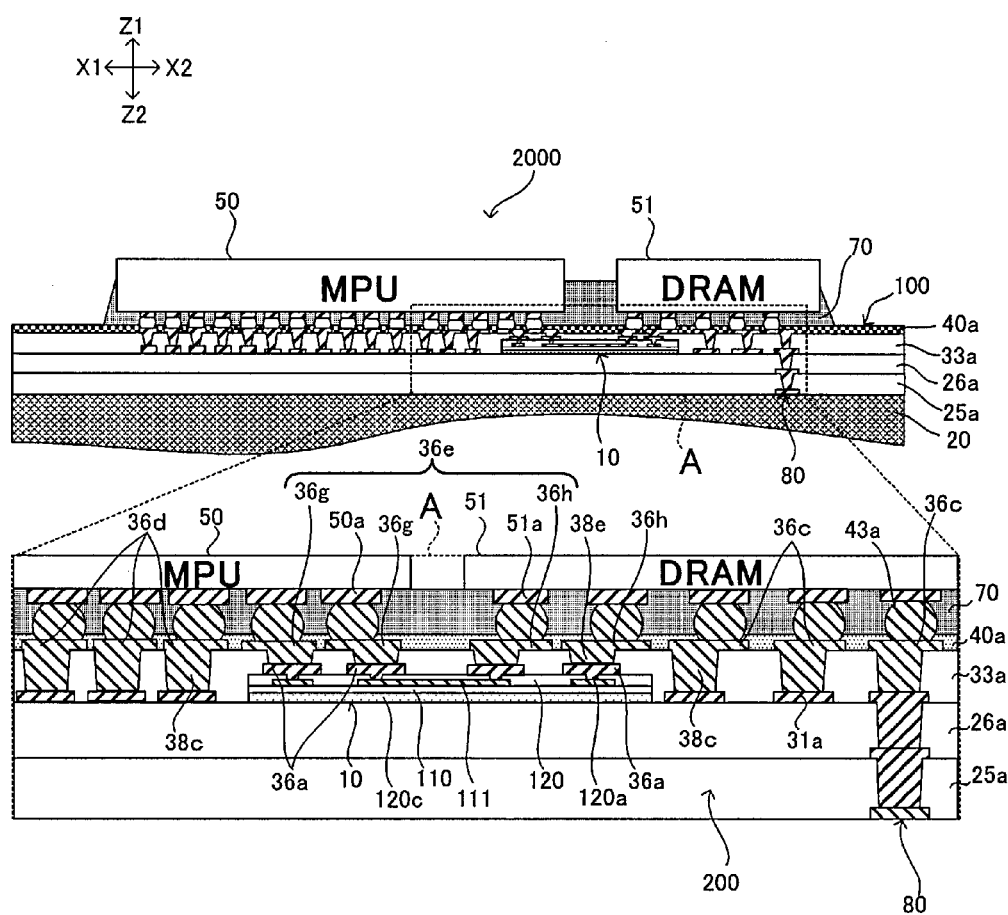
FIG. 1A is a cross-sectional view showing a package substrate where a wiring board according to a first embodiment of the present invention is used (the lower view is an enlarged cross section of region "A," which is a part of the upper view)

The embodiments will now be described with reference to the accompanying drawings, wherein like reference numerals designate corresponding or identical elements throughout the various drawings.

In the drawings, arrows (Z1, Z2) each indicate a lamination direction in a wiring board (or a thickness direction of the wiring board) corresponding to a direction along a normal line to the main surfaces (upper and lower surfaces) of the wiring board. On the other hand, arrows (X1, X2) and (Y1, Y2) each indicate a direction perpendicular to a lamination direction (or a direction to a side of each layer). The main surfaces of the wiring board are on the X-Y plane. Side surfaces of the wiring board are on the X-Z plane or the Y-Z plane. In a lamination direction, a layer closer to the core of the wiring board is referred to as a lower layer, and a layer farther from the core is referred to as an upper layer.

In the following embodiments, conductive layers are formed to have one or multiple conductive patterns. A conductive layer may include a conductive pattern that forms an electrical circuit, such as wiring (including ground), a pad, a land or the like. Alternatively, a conductive layer may include a planar conductive pattern that does not form an electrical circuit.

Opening portions include a hole, a groove, a notch, a slit or the like.

Among the conductors formed in opening portions, the conductor formed in a via hole is referred to as a via conductor, the conductor formed in a through hole is referred to as a through-hole conductor, and the conductor filled in an opening portion is referred to as a filled conductor.

A land is the conductor formed on a hole (via hole, through hole or the like) or on the periphery of the hole. At least part of the land is formed to be contiguous to the conductor inside the hole (via conductor, through-hole conductor or the like).

"Being stacked" means that a via conductor is formed on the land of a via conductor formed in the lower layer. Namely, via conductors are stacked unless the bottom surface of a via conductor is off the land of its lower via conductor. Multiple vias stacked as above are referred to as stacked vias.

Plating includes dry plating such as PVD (Physical Vapor Deposition), CVD (Chemical Vapor Deposition) or the like, in addition to wet plating such as electrolytic plating, electroless plating or the like.

Interlayer insulation film (brand name: ABF-45SH, made by Ajinomoto), for example, is used for interlayer insulation layers and resin material used in a wiring structure.

Unless otherwise specified, the "width" (or thickness) of a hole or a column (protrusion) indicates the diameter if it is a circle, and $2\sqrt{\text{cross-sectional area}/\pi}$ if it is other than a circle. However, measurements are not limited to the above definitions if they are clearly indicated otherwise. Also, when the measurements are not uniform (roughened surface or tapering width, for example), basically, the average value of a measurement is used (average value of effective values excluding an abnormal value), unless it is clearly specified to use values other than the average value, for example, a maximum value.

First Embodiment

Wiring board 100 according to a first embodiment is a multilayer printed wiring board as shown in FIG. 1A, for example. Wiring board 100 of the present embodiment is a buildup laminated multilayer wiring board having a core substrate. However, a wiring board related to the present invention is not limited to a buildup laminated multilayer wiring board having a core substrate, and may be a double-sided rigid wiring board, flexible wiring board, or a flex-rigid wiring board, for example. Also, in wiring board 100, the measurements of conductive layers and insulation layers, the number of layers or the like may be modified freely within the scope of the technological concept of the present invention.

Figure 1B:
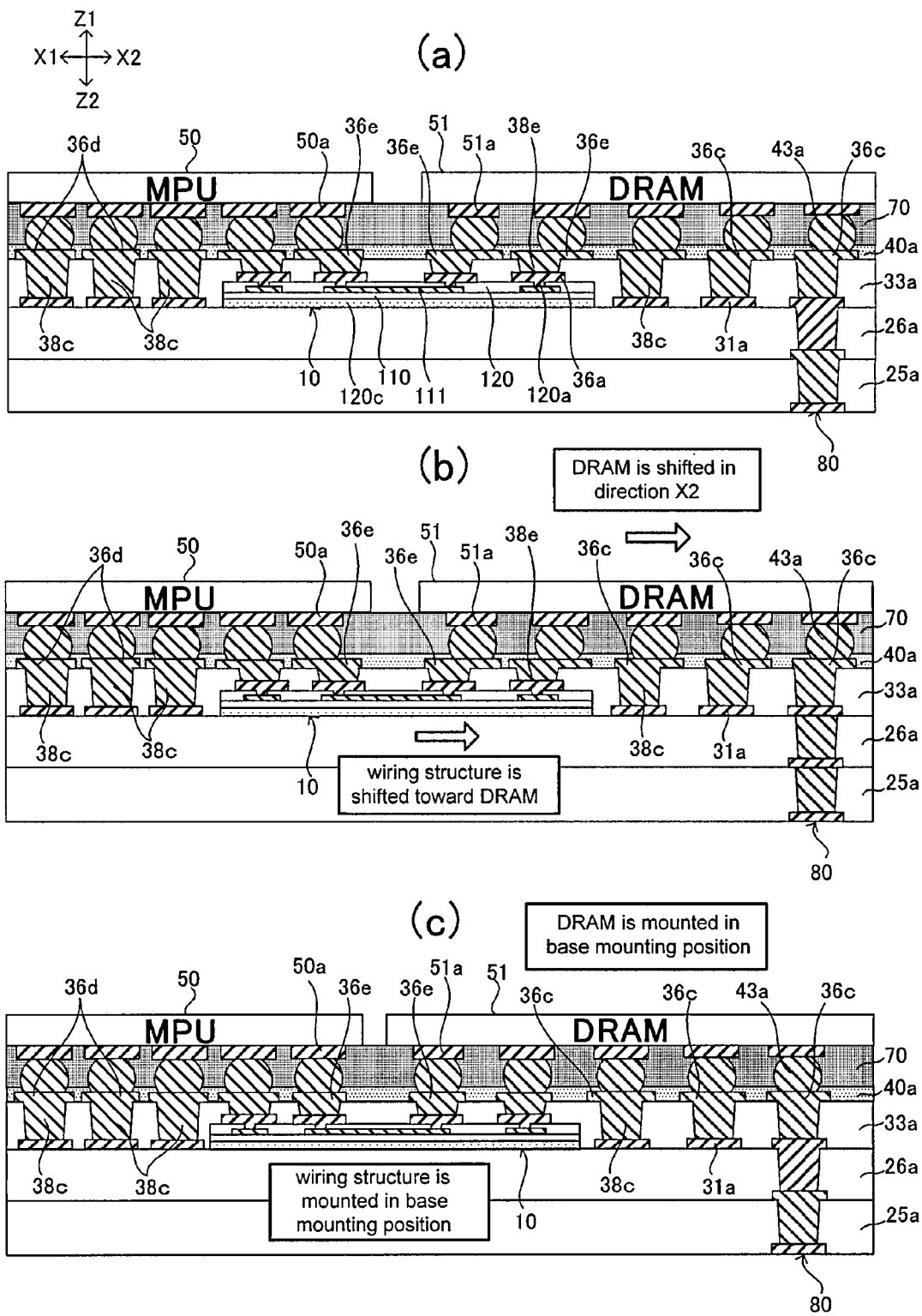
FIG. 1B(a) is a cross-sectional view showing in detail a wiring board of the first embodiment.
Figure 1C:
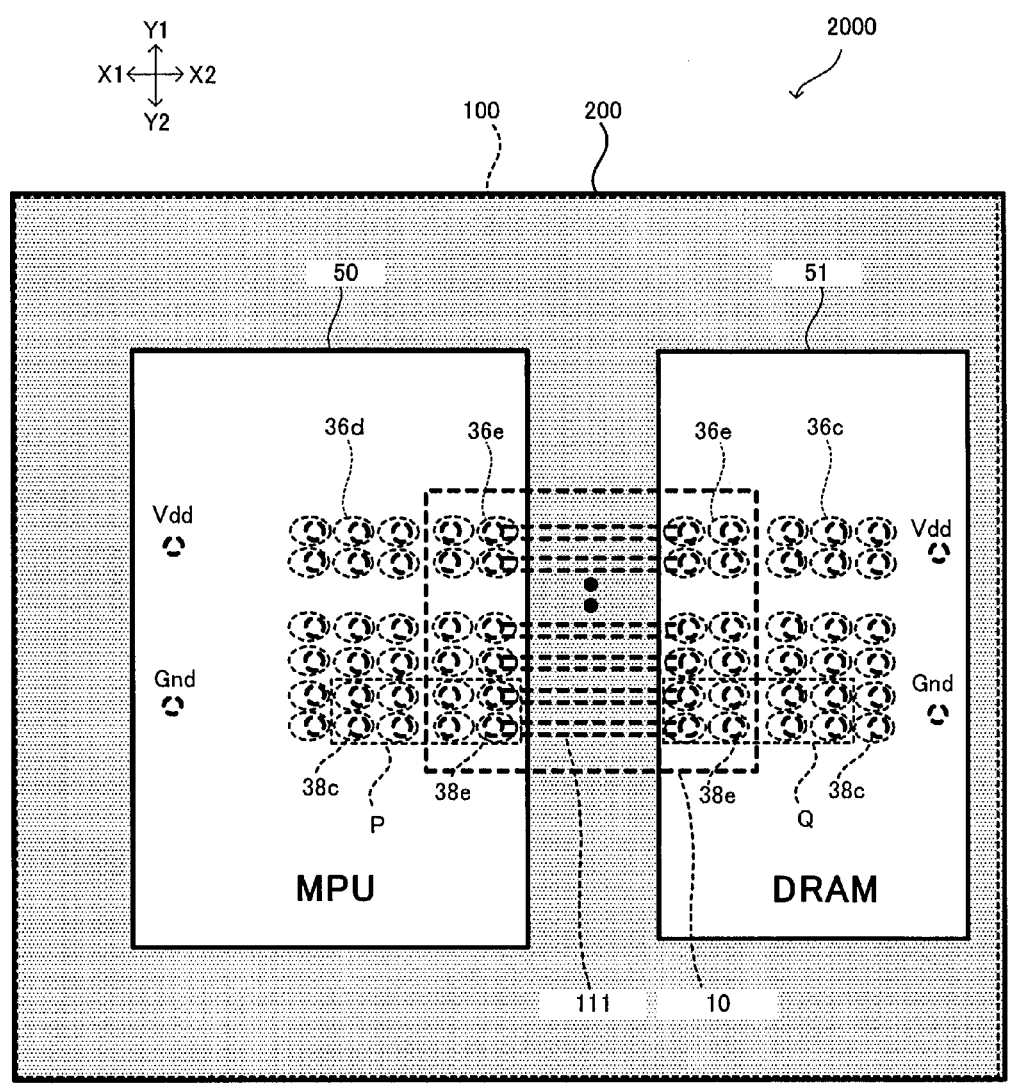
FIG. 1C is a plan view of FIG. 1(B)(a) seen from the Z2 direction.
Figure 2:
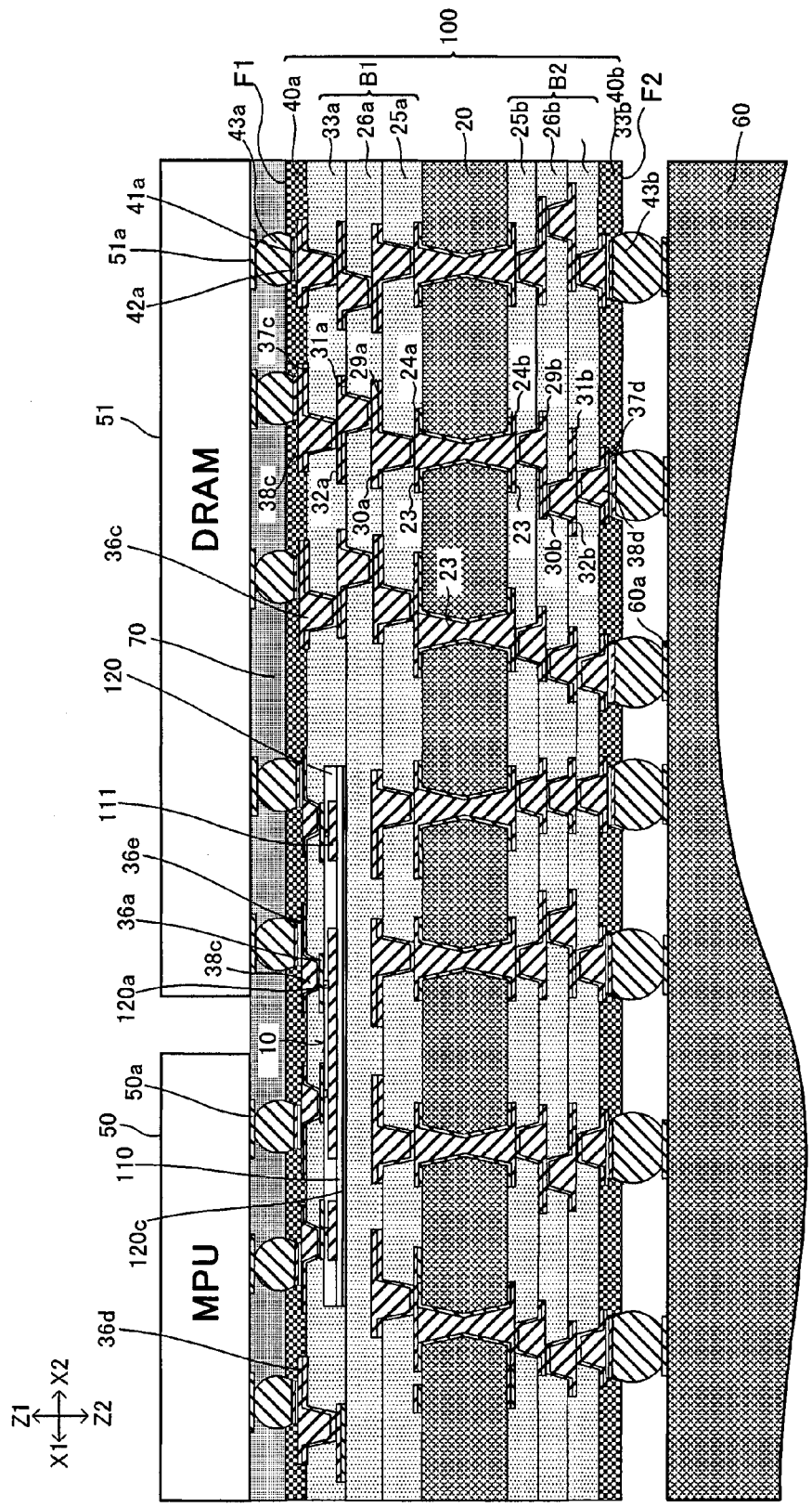
FIG. 2 is a cross-sectional view showing in detail a package substrate where the wiring board according to the first embodiment is used.

As shown in FIGS. 1A, 1C and 2, microprocessor MPU (Micro-Processing Unit) 50 as a first semiconductor element and dynamic RAM (dynamic random access memory) 51 as a second semiconductor element are mounted on wiring board 100 to form package substrate 2000. Wiring board 100 is mounted on motherboard 60 as shown in FIG. 2. Spaces among wiring board 100, MPU 50 and DRAM 51 are encapsulated with underfill resin 70.

As shown in FIG. 2, wiring board 100 has core substrate 20, interlayer insulation layers (25a, 26a, 33a, 25b, 26b, 33b), conductive layers (24a, 29a, 31a, 37c, 24b, 29b, 31b, 37d), via conductors (23, 30a, 32a, 38c, 30b, 32b, 38d), and solder-resist layers (40a, 40b) formed on the uppermost layers.

Core substrate 20 (wiring board 100) has first surface (F1) (Z1 side) and its opposing second surface (F2) (Z2 side), and via conductors 23 penetrate through core substrate 20. Core substrate 20, via conductors 23, and conductive layers (24a, 24b) correspond to the core section. In addition, buildup section (B1) (first laminated section) is formed on first surface (F1) of core substrate 20, and buildup section (B2) (second laminated section) is formed on second surface (F2) of core substrate 20. Buildup section (B 1) includes three pairs of interlayer insulation layers and conductive layers (interlayer insulation layers (25a, 26a, 33a) and conductive layers (24a, 29a, 31a, 37c)), and buildup section (B2) includes three pairs of interlayer insulation layers and conductive layers (interlayer insulation layers (25b, 26b, 33b) and conductive layers (24b, 29b, 31b, 37d)). In addition, conductive layer (37c) includes conductive pads (36c, 36d, 36e).

On the first-surface (F1) side of core substrate 20, four conductive layers (24a, 29a, 31a, 37c) and three interlayer insulation layers (25a, 26a, 33a) are alternately laminated upward from below (Z2 side). Interlayer insulation layers (25a, 26a, 33a) are formed between their respective conductive layers (24a, 29a, 31a, 37c). Also, solder-resist layer (40a) is positioned on the surface of the first-surface (F 1) side uppermost layer of core substrate 20.

On the second-surface (F2) side of core substrate 20, four conductive layers (24b, 29b, 31b, 37d) and three interlayer insulation layers (25b, 26b, 33b) are alternately laminated downward from above (Z1 side). Interlayer insulation layers (25b, 26b, 33b) are formed between their respective conductive layers (24b, 29b, 31b, 37d). Also, solder-resist layer (40b) is positioned on the surface of the second-surface (F2) side uppermost layer of core substrate 20.

Penetrating holes 21 (see FIG. 7B) which penetrate through core substrate 20 are formed in core substrate 20. Via conductors 23 are filled conductors, and are formed by filling a conductor in penetrating holes 21. Conductive layer (24a) on first surface (F 1) of core substrate 20 and conductive layer (24b) on second surface (F2) of core substrate 20 are electrically connected by via conductors 23.

Core substrate 20 is made by impregnating core material with resin, for example. Core substrate 20 is obtained by, for example, impregnating fiberglass cloth with epoxy resin, thermosetting the resin, and molding the resin into a plate shape. However, that is not the only option, and any other material may be used for core substrate 20.

Via conductor 23 is formed to be a column in an hourglass shape with a diameter decreasing from first surface (F1) and second surface (F2) of core substrate 20 toward its center, for example. In addition, the planar shape of via conductor 23 (cross section on the X-Y plane) is a perfect circle, for example. However, those are not the only options, and via conductor 23 may be set in any other shape.

Via conductors (30a, 32a, 38c, 30b, 32b, 38d) are formed in their respective interlayer insulation layers (25a, 26a, 33a, 25b, 26b, 33b). Those via conductors are filled conductors, and are formed by filling a conductor in via holes that penetrate through their respective interlayer insulation layers. Via conductors (30a, 32a, 38c, 30b, 32b, 38d) are each a tapered column (truncated cone), tapering with a diameter decreasing toward core substrate 20. Their planar shapes (cross sections on the X-Y plane) are an ellipse or a perfect circle, for example. However, those are not the only options, and via conductors (30a) and the like may be set in any other shape.

Interlayer insulation layer (25a) (lowermost interlayer insulation layer of buildup section (B1)), interlayer insulation layer (25b) (lowermost interlayer insulation layer of buildup section (B2)), and their respective upper interlayer insulation layers (26a, 33a, 26b, 33b) are each made of interlayer insulation film (brand name: ABF-45SH, made by Ajinomoto). However, that is not the only option, and the material for each insulation layer may be selected freely.

Solder bumps (43a) are provided in the uppermost layer of wiring board 100. Solder bumps (43a) are electrically connected to MPU 50 and DRAM 51 through conductive pads (50a, 51a).

More specifically, conductive pad (36c) formed in conductive layer (37c) is connected to conductive pad (51a) of DRAM 51 through solder bump (43a), while conductive pad (36d) formed in conductive layer (37c) is connected to conductive pad (50a) of MPU 50 through solder bump (43a).

In the present embodiment, wiring board 100 includes main wiring board 200 and wiring structure 10 provided inside main wiring board 200. The wiring of wiring structure 10 is designed not according to wiring rules for multilayer printed wiring boards, but according to wiring rules for semiconductor elements such as ICs and LSIs as described later in detail. Compared with main wiring board 200, wiring structure 10 is designed to have a finer L/S (line and space), a ratio of line to space which is an index of wiring density. Here, the line indicates a pattern width, and a space indicates the gap between patterns, which is the distance between centers of pattern widths. In particular, wiring structure 10 is formed to have high wiring density so that the ratio of line to space, L/S (line and space), is 1 µm/1 µm to 5 µm/5 µm, preferably 3 µm/3 µm to 5 µm/5 µm. Such an L/S is a fine level, compared with the L/S of a regular multilayer printed wiring board, including main wiring board 200 of the present embodiment, which is usually set at approximately 10 µm/10 µm.

Main wiring board 200 includes signal transmission lines and power-supply lines to power-source terminals (Vdd) of semiconductor elements, MPU 50 and DRAM 51 (see FIGS. 1A and 1C).

Figure 3:
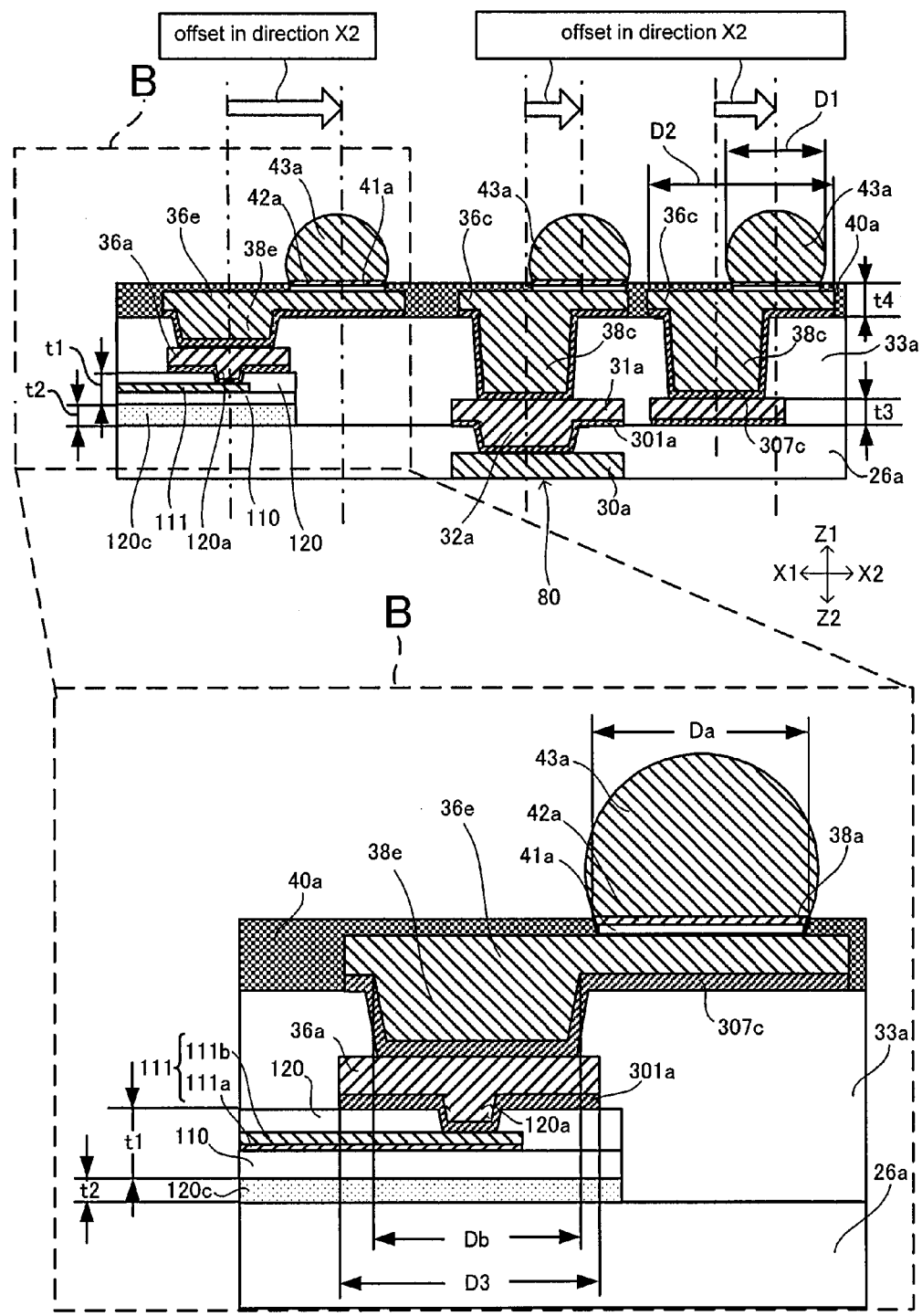
FIG. 3 is an enlarged view of a portion of the wiring board according to the first embodiment (the lower view is an enlarged cross section of region "B," which is a part of the upper view)

Wiring structure 10 includes lowermost adhesive layer (120c), insulation layer 110 on adhesive layer (120c), insulation layer 120 on insulation layer 110, and conductive patterns 111 for signal transmission formed in insulation layer 120. Conductive patterns 111 are made of first conductive film (111a) and second conductive film (111b) as shown in FIG. 3. For insulation layers (110, 120), polyimide, phenolic resin or polybenzoxazole resin may be used as insulative material. Wiring structure 10 is positioned in interlayer insulation layer (33a). In addition, conductive pads (36a) for connection with conductive pads (50a) of MPU 50 and conductive pads (51a) of DRAM 51 (see FIG. 1A) are formed on wiring structure 10. Also, the pattern width of conductive patterns 111 in wiring structure 10 is smaller than the pattern widths of conductive layers (37c, 31a, 29a, 24a) of main wiring board 200.

As the material for adhesive layer (120c), an epoxy-resin-based, acrylic-resin-based or silicone-resin-based adhesive agent or the like may be used, for example. Small-diameter holes are formed in insulation layer 120. By filling conductor in those holes, via conductors (120a) are formed as filled vias.

Wiring structure 10 does not include a power-supply line, but includes only signal-transmission lines, and is used for transmitting signals between MPU 50 and DRAM 51. More specifically, conductive patterns 111 are used for transmitting signals between MPU 50 and DRAM 51, but are not used for supplying power to MPU 50 and DRAM 51. Power terminals (Vdd) of MPU 50 and DRAM 51 are electrically connected to stacked vias 80 in main wiring board 200 (see FIGS. 1A and 3) so that power is directly supplied from an external DC power source. Ground terminals (Gnd) of MPU 50 and DRAM 51 (see FIG. 1C) are connected to ground through other stacked vias in main wiring board 200.

Via conductors (120a) are electrically connected to upper conductive pads (36a). Conductive pads (36a) are electrically connected to MPU 50 and DRAM 51 through upper via conductors (38e), solder bumps (43a) and conductive pads (50a, 51a). In wiring board 100 of the present embodiment, insulation layer 110 is disposed between conductive patterns 111 and adhesive layer (120c). Namely, wiring structure 10 is triple-layered. However, that is not the only option, and wiring structure 10 may be double-layered where insulation layer 110 is not disposed and conductive patterns 111 are formed directly on adhesive layer (120c). Also, referring to FIG. 1A, among conductive pads (36e) connected to conductive patterns 111 of wiring structure 10, the distance between conductive pads (36g) (first pads) connected to MPU 50 is shorter than the distance between conductive pads (36h) (second pads) connected to DRAM 51. In addition, the distance between adjacent conductive patterns 111 is shorter than the distance between adjacent conductive layers (conductive patterns) (31a).

Conductive pads (36a) connected to conductive patterns 111 of wiring structure 10 are connected by via conductors (38e) to conductive pads (36e) formed directly above wiring structure 10 and on interlayer insulation layer (33a). Conductive pads (36e) along with conductive pads (36c) and conductive pads (36d) are formed in conductive layer (37c) (see FIG. 2) formed on interlayer insulation layer (33a).

Referring to FIG. 1A, conductive pads (36e) are connected through solder bumps (43a) to conductive pads (50a, 51a) of MPU 50 and DRAM 51.

The diameter of via conductors (120a) is preferred to be 1 µm or greater but 10 µm or less, more preferably 0.5 µm or greater but 5 µm or less. By setting the diameter of via conductors (120a) at such a microscopic size, the flexibility of wiring distribution at conductive patterns 111 is enhanced in wiring structure 10; for example, a greater number of wiring lines can be distributed from either a left or a right side of wiring structure 10 at conductive patterns 111 formed only in one insulation layer 120. In addition, since conductive patterns 111 are formed only in one layer, it contributes to reducing the number of wiring layers in wiring structure 10.

With metal layers (301a, 307c) made of metal foil such as copper foil, electroless copper-plated film and electrolytic copper-plated film disposed in between, via conductors (32a, 38c) are provided in via holes formed respectively in interlayer insulation layers (26a, 33a) as shown in FIG. 3.

Among the measurements of via conductors shown in FIG. 3, diameter (D2) (width) on the top surface of via conductor (38c) is 62 µm, for example, and diameter (D1) of solder bump (43a) is 46 µm, for example. In addition, thickness (t1) of wiring structure 10 (except for adhesive layer (120c)) is 25 µm, for example, thickness (t2) of adhesive layer (120c) of wiring structure 10 is 10 µm, for example, thickness (t3) of conductive layer (31a) is 15 µm, for example, and thickness (t4) of solder-resist layer (40a) is 15 µm, for example. As described, by setting thickness (t2) of adhesive layer (120c) of wiring structure 10 to be approximately 10 µm, sufficient adhesive power with main wiring board 200 is obtained, expanding the flexibility for selecting the material to be used for adhesive layer (120c). Also, diameter (D3) of conductive pads (36a) on wiring structure 10 is 15 to 25 µm.

Solder bumps (43a) are positioned on conductive layer (37c) in opening portions (SRO) (38a) of solder-resist layers (40a, 40b) (see FIG. 2). Nickel-plated layer (41a) and gold-plated layer (42a) are formed between solder bump (43a) and conductive layer (37c) (see FIG. 3). In the present embodiment, diameter (Da) of opening portions (38a) of solder-resist layers (40a, 40b) is approximately 10% longer than diameter (Db) of opening portions of via conductors (38e) in uppermost layers. As described, when diameter (Da) of opening portions (38a) of solder-resist layers (40a, 40b) is greater than diameter (Db) of opening portions of via conductors (38e), the usual result is narrow tolerance during the manufacturing process. However, since the diameter of via conductors (120a) in wiring structure 10 is small, that is, 1 µm or greater but 10 µm or less, even if positional shifting occurs when wiring structure 10 is mounted on (adhered to) main wiring board 200, it has an advantage of a wider range to ensure electrical connection.

In the present embodiment, conductive pads (36e) positioned above wiring structure 10 are set off from conductive pads (36a) toward MPU 50 and toward DRAM 51 as seen in FIG. 1B (a). More specifically, conductive pads (36e) positioned closer to MPU 50 are set off toward MPU 50 from conductive pads (36a), whereas conductive pads (36e) positioned closer to DRAM 51 are set off toward DRAM 51 from conductive pads (36a). Here, as described later, the set off amount is determined based on the amount of positional shifting made by wiring structure 10 during its mounting procedure.

Also, in the present embodiment, conductive pads (36c) below DRAM 51 are set off from the designated base position in direction (X2) (toward the side away from wiring structure 10), whereas conductive pads (36d) below MPU 50 are provided at the base position. However, conductive pads (36d) may be set off from the base position in direction (X1) or (X2).

As shown in FIG. 1B (b), the present embodiment is set under such conditions that wiring structure 10 is shifted toward DRAM 51 from the designated base mounting position when wiring structure 10 is mounted on wiring board 200. In addition, the present embodiment is also set under such conditions that DRAM 51 is shifted from the base mounting position in direction (X2) (direction away from wiring structure 10). Here, if wiring structure 10 is shifted toward MPU 50 from the designated base mounting position, the technological concept of the present invention is also applicable. Moreover, it is another option for DRAM 51 to be mounted on the base mounting position without positional shifting in direction (X2) (direction away from wiring structure 10).

As described above, conductive pads (36e) positioned above wiring structure 10 are set off from conductive pads (36a) toward MPU 50 and toward DRAM 51 in the present embodiment. Accordingly, even if wiring structure 10 is shifted from the base mounting position shown in FIG. 1B (c) toward DRAM 51 as shown in FIG. 1B (b) when wiring structure 10 is mounted on main wiring board 200, conductive pads (36a) of wiring structure 10 are made sure to be connected to conductive pads (50a, 51a) of MPU 50 and DRAM 51. Furthermore, if DRAM 51 is shifted in direction (X2) as shown in FIG. 1B (b) (direction away from wiring structure 10) at that time, since conductive pads (36c) are set off in direction (X2) from the base position, stable connection is provided to conductive pad (36c) and conductive pad (51a) of DRAM 51.

As a result, connection failure of conductive pads (50a, 51a) of MPU 50 and DRAM 51 to wiring structure 10 is reduced. Then, MPU 50 and DRAM 51 are mounted on wiring board 100 with a stable connection to wiring structure 10.

Moreover, since conductive pads (36c, 36e) are set off from their base positions based on the amount of positional shifting made by wiring structure 10 during the mounting process, it is not necessary to change pad intervals (terminal intervals) of MPU 50 and DRAM 51 in the present embodiment. Thus, customizing MPU 50 and DRAM 51 is not necessary, and generic MPU 50 and DRAM 51 can be mounted on wiring board 100 to form a package substrate.

Figure 1D:
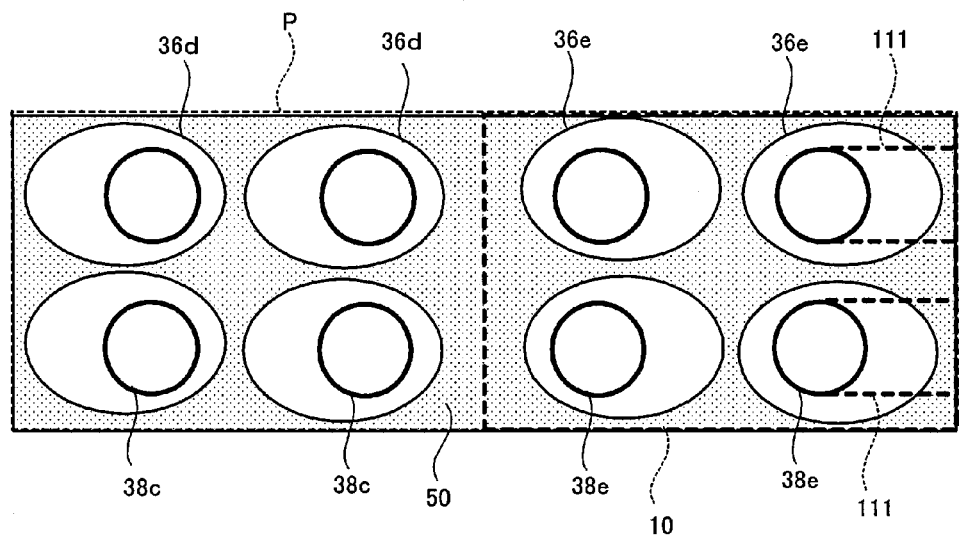
FIG. 1D(a) is an enlarged plan view of region "P" in FIGS. 1C; and 1D(b): an enlarged plan view of region "Q" in FIG. 1C.
Figure 1D:
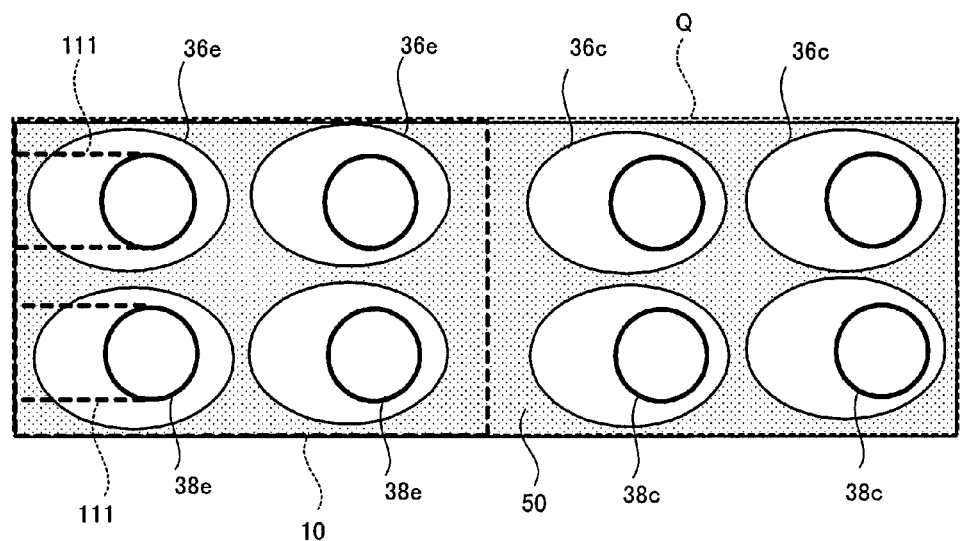

In addition, in the present embodiment, conductive pads (36c, 36d, 36e), which are larger than a standard size required for mounting MPU 50 and DRAM 51, are formed in an elliptical shape on a planar view as shown in FIG. 1D. Accordingly, if a so-called "θ" shifting (rotational shifting) occurs in wiring structure 10, the tolerance for such positional shifting is enlarged. Conductive pads (36c, 36d, 36e) may be oval or rectangular, for example, as long as they are larger than a standard size required for mounting MPU 50 and DRAM 51.

A through hole that penetrates through all the layers of main wiring board 200 is not formed in wiring board 100 of the present embodiment. However, that is not the only option, and a through hole penetrating all the layers of main wiring board 200 may be formed to electrically connect conductive layers on uppermost layers to each other and to use for transmitting signals or supplying power to semiconductor elements on wiring board 100.

According to wiring board 100 of the present embodiment, main wiring board 200 has built-in wiring structure 10 which has a higher wiring density than main wiring board 200 and is used for transmitting signals between semiconductor elements. Accordingly, design flexibility of wiring board 100 as a multilayer printed wiring board is enhanced. For example, concentration of all the power-source wiring and signal wiring in a specific region of the wiring board is prevented. Also, a structure where only resin is provided without including any conductor can be avoided in a region which is near an electronic component but where no electronic component is present.

A description is provided for an example of the method for manufacturing wiring board 100 according to the present embodiment. The process for manufacturing wiring board 100 is made up of the process for manufacturing wiring structure 10 and of the process for manufacturing main wiring board (multilayer printed wiring board) 200, which includes steps for mounting wiring structure 10 on main wiring board 200. Wiring structure 10 is manufactured by a process shown in FIG. 4, for example.

Process for Manufacturing Wiring Structure

Figure 4:
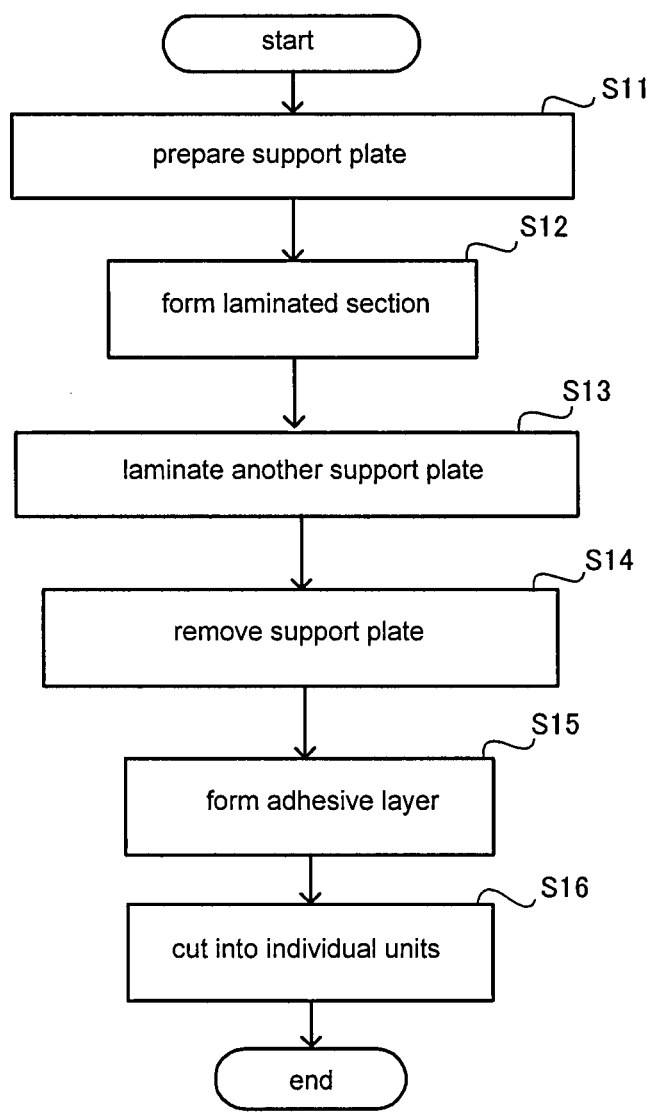
FIG. 4 is a flowchart showing a process for manufacturing a wiring structure according to the first embodiment.
Figure 5A:
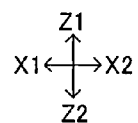
FIG. 5A is a view illustrating a step in a method for manufacturing a wiring structure shown in FIG. 4.
Figure 5A:

In step (S11) of FIG. 4, support plate 1001 is prepared as shown in FIG. 5A. Support plate 1001 is made of glass with a flat surface, for example. Then, release agent 1002 is applied on support plate 1001.

In step (S12) of FIG. 4, a laminated section is formed on support plate 1001 with release agent 1002 disposed in between. Such a laminated section is formed by alternately laminating a resin insulation layer and a conductive pattern (conductive layer).

Figure 5B:
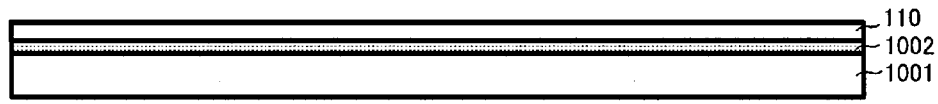
FIG. 5B is a view illustrating a step in the method for manufacturing a wiring structure shown in FIG. 4.
Figure 5C:
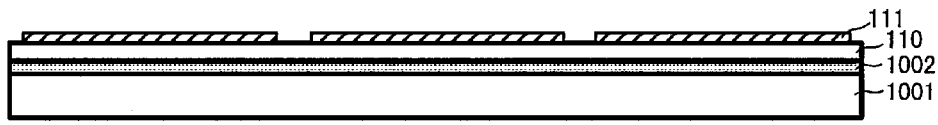
FIG. 5C is a view illustrating a step in the method for manufacturing a wiring structure shown in FIG. 4.

More specifically, insulation layer 110 (resin insulation layer) made of resin, for example, is positioned on release agent 1002 as shown in FIG. 5B. Heat is applied, for example, to adhere insulation layer 110 and release agent 1002.

Next, as shown in FIG. 5B, using a semi-additive (SAP) method, for example, conductive patterns 111 are formed on insulation layer 110. Conductive patterns 111 are made of first conductive film (111a) and second conductive film (111b) (see FIG. 3). More specifically, first conductive film (111a) is double-layered with a Ti layer (lower layer) and a Cu layer (upper layer). Such metal layers are formed by sputtering, for example, and excellent adhesiveness is achieved between fine conductive patterns 111 and the base material. Also, second conductive film (111b) is made of electroless copper-plated film on the Cu layer and electrolytic plated film on the electroless copper-plated film.

Conductive patterns 111 are formed to be high density, setting a ratio of line to space, L/S (line and space), at 1 μm/1 μm to 5 μm/5 μm, preferably 3 μm/3 μm to 5 μm/5 μm. Here, a line indicates a pattern width, and a space indicates the gap between patterns, which is the distance between centers of pattern widths. Wiring density here is formed according to wiring rules the same as those used when wiring is formed in semiconductor elements such as ICs (Integrated Circuits) and LSIs (Large-Scale Integrated Circuits).

Figure 5D:
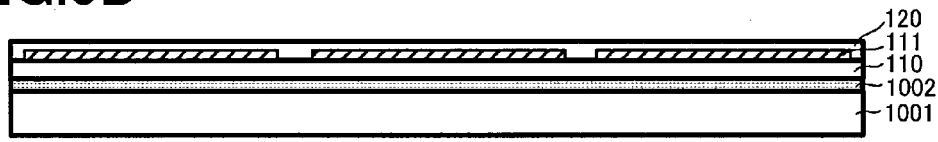
FIG. 5D is a view illustrating a step in the method for manufacturing a wiring structure shown in FIG. 4.

As shown in FIG. 5D, insulation layer 120 is formed on insulation layer 110 by lamination or the like, for example. Insulation layer 120 is formed to cover conductive patterns 111.

Next, using a laser, for example, holes (via holes) are formed in insulation layer 120. Holes are formed to reach conductive patterns 111 to expose their portions. The diameter of holes is set to be 1 μm or greater and 10 μm or smaller, preferably 0.5 μm or greater and 5 μm or smaller, to form microscopic holes. Then, desmearing or soft etching is performed if needed.

Using a semi-additive (SAP) method, for example, via conductors (120a) are formed in the holes (filled conductors) while conductive pads (conductive layer) (36a) are formed on insulation layer 120 to be connected to via conductors (120a).

Figure 5E:
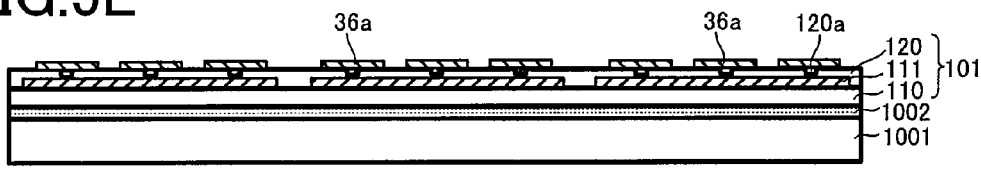
FIG. 5E is a view illustrating a step in the method for manufacturing a wiring structure shown in FIG. 4.

Accordingly, laminated section 101 having insulation layers (110, 120) and conductive patterns 111 is formed on support plate 1001 as shown in FIG. 5E. Also, via conductors (120a) and conductive pads (36a) are respectively formed in and on insulation layer 120 of laminated section 101.

Figure 5F:
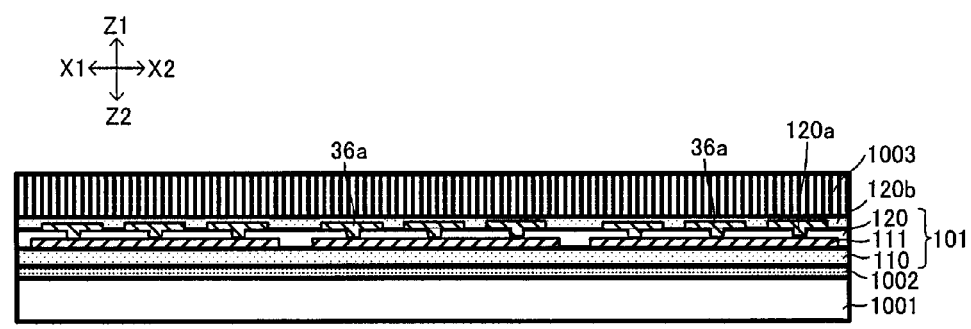
FIG. 5F is a view illustrating a step in the method for manufacturing a wiring structure shown in FIG. 4.

In step (S13) of FIG. 4, another support plate 1003 is prepared as shown in FIG. 5F. Support plate 1003 is made of glass with a flat surface, for example, the same as support plate 1001. Then, support plate 1003 is laminated on laminated section 101 with adhesive layer (120b) disposed in between.

Figure 5G:
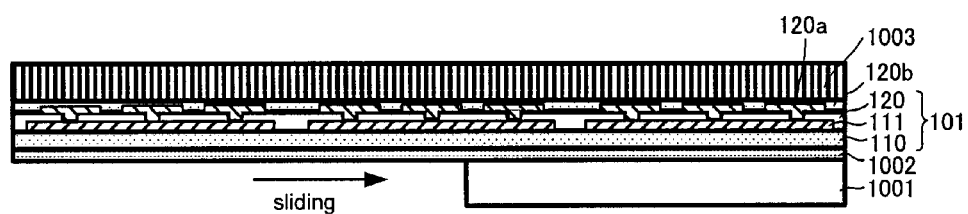
FIG. 5G is a view illustrating a step in the method for manufacturing a wiring structure shown in FIG. 4.
Figure 5H:
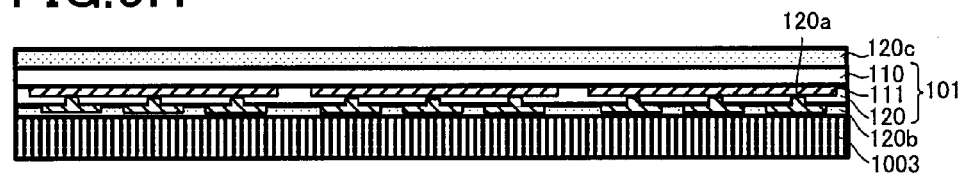
FIG. 5H is a view illustrating a step in the method for manufacturing a wiring structure shown in FIG. 4.

In step (S14) of FIG. 4, support plate 1001 is removed. More specifically, as shown in FIG. 5G, release agent 1002 is softened by applying heat, for example, and support plate 1001 is slid in a direction X (or a direction Y) so that support plate 1001 is removed from the second main surface of laminated section 101. Here, if release agent 1002 remains on the second main surface of laminated section 101 after support plate 1001 is removed from laminated section 101, cleansing is conducted to remove the residual release agent 1002. Accordingly, a substrate is obtained where laminated section 101 is formed on support plate 1003 as shown in FIG. 5H. Support plate 1001 is recyclable after being cleansed or the like. Instead of glass material, epoxy substrate or the like containing glass cloth may also be used for support plate 1001.

In step (S15) of FIG. 4, using an epoxy-resin-based, acrylic-resin-based or silicone-resin-based adhesive agent or the like, adhesive layer (120c) is formed on laminated section 101. More specifically, adhesive layer (120c) is formed, for example, by laminating an adhesive agent on laminated section 101 by a laminator so as to obtain a uniform thickness.

Figure 5I:
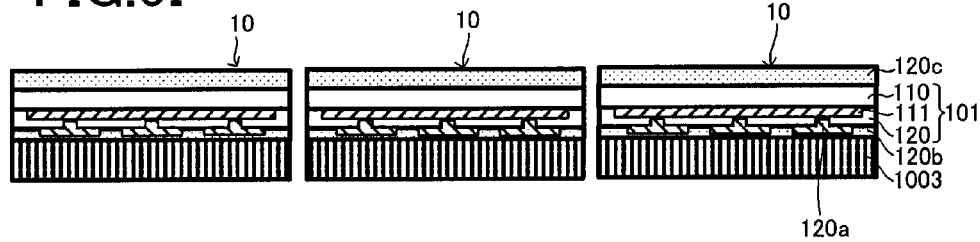
FIG. 5I is a view illustrating a step in the method for manufacturing a wiring structure shown in FIG. 4.

In step (S16) of FIG. 4, using a dicing saw, for example, wiring board 100 is cut along predetermined dicing lines to make individual units as shown in FIG. 5I. Accordingly, multiple wiring structures 10 are obtained. Wiring structure 10 obtained here is formed by forming laminated section 101 on support plate 1003 with adhesive layer (120b) disposed in between and by further forming adhesive layer (120c) on laminated section 101.

The method for manufacturing wiring structure 10 of the present embodiment is suitable for manufacturing wiring structure 10 since flat-surface glass plates are used for support plates (1001, 1003). According to such a manufacturing method, a high-quality wiring board 100 with flat surfaces is obtained where a degree of warping is suppressed.

Next, main wiring board 200 is manufactured while wiring structure 10 is mounted on main wiring board 200 so that wiring board 100 of the present embodiment is obtained. Wiring board 100 is manufactured by a process shown in FIG. 6, for example.

Process for Manufacturing Wiring Board

Figure 6:
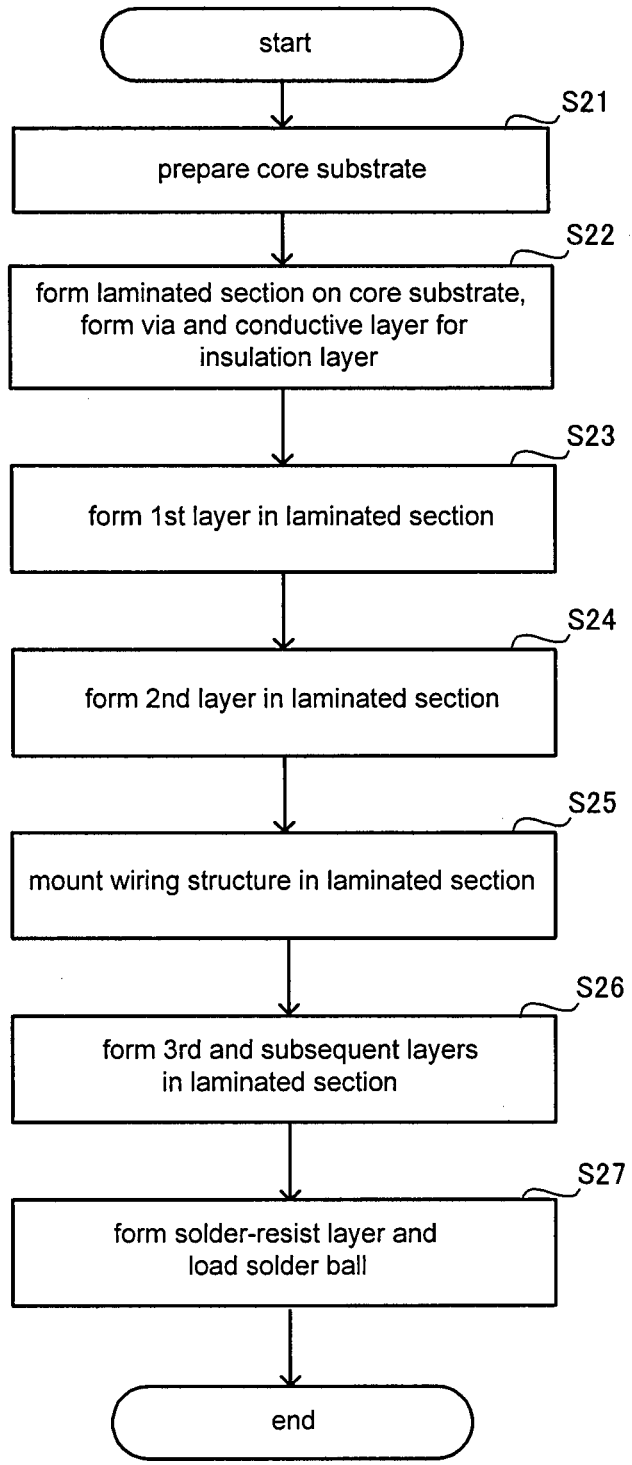
FIG. 6 is a flowchart showing a process for manufacturing a wiring board according to the first embodiment.
Figure 7A:
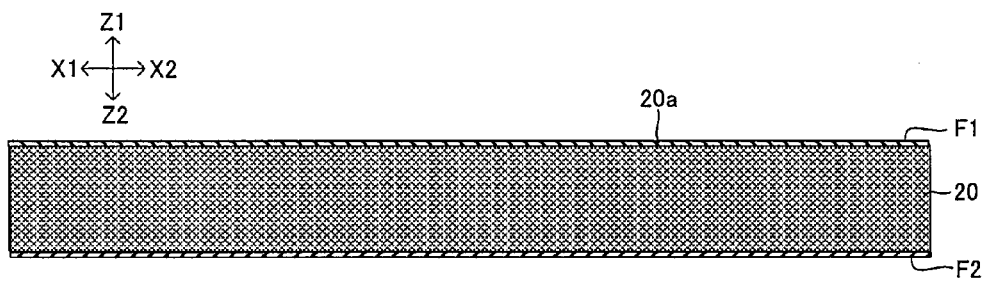
FIG. 7A is a view illustrating a step in a method for manufacturing a wiring board shown in FIG. 6.

First, in step (S21) of FIG. 6, core substrate 20 made of reinforcing material impregnated with resin is prepared as shown in FIG. 7A. On first surface (F1) and second surface (F2) of core substrate 20, copper foil (20a) is formed by lamination. The thickness of core substrate 20 is 0.4 to 0.7 mm, for example. Glass cloth, aramid fiber, fiberglass or the like, for example, may be used for the reinforcing material. Epoxy resin, BT (bismaleimide triazine) resin or the like, for example, may be used for the resin. In the resin, particles made of hydroxide are further contained. Examples of hydroxides are metal hydroxide such as aluminum hydroxide, magnesium hydroxide, calcium hydroxide and barium hydroxide. When heat is applied, hydroxides decompose and generate water. Thus, hydroxides are thought to be capable of robbing heat from the material of the core substrate. Namely, when the core substrate contains a hydroxide, processability by a laser is thought to improve.

Next, a solution containing NaOH (10 g/L), NaClO$_2$ (40 g/L) and Na$_3$PO$_4$ (6 g/L) is applied on the surface of copper foil (20a) to perform black-oxide treatment through a blackening bath (oxidation bath).

Figure 7B:
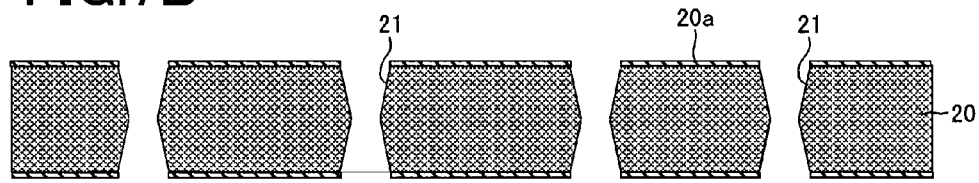
FIG. 7B is a view illustrating a step in the method for manufacturing a wiring board shown in FIG. 6.

In step (S22) of FIG. 6, laser light is irradiated using a CO$_2$ laser from the first-surface (F1) (upper-surface) side and the second-surface (F2) (lower-surface) side of core substrate 20 to form penetrating holes 21 which penetrate through core substrate 20 as shown in FIG. 7B. More specifically, using a CO$_2$ laser, by irradiating laser light alternately from the first-surface (F1) side and the second-surface (F2) side of core substrate 20, holes formed from the first-surface (F1) side and the second-surface (F2) side are connected to each other so that penetrating holes 21 are formed.

Next, desmearing is performed by immersing core substrate 20 in a solution containing permanganic acid at a predetermined concentration. At that time, the treatment is preferred to be performed in a way that the weight reduction of core substrate 20 is 1.0 wt. % or less, preferably 0.5 wt. % or less. Since core substrate 20 is made by impregnating resin into reinforcing material such as glass cloth, the glass cloth will protrude into a penetrating hole when the resin is dissolved through a desmearing treatment. If the degree of weight reduction of core substrate 20 is set as above, the degree of protrusion of glass cloth is suppressed, and voids are prevented from remaining when plating is filled in the penetrating holes. Then, a palladium catalyst is attached to surfaces of core substrate 20.

Figure 7C:
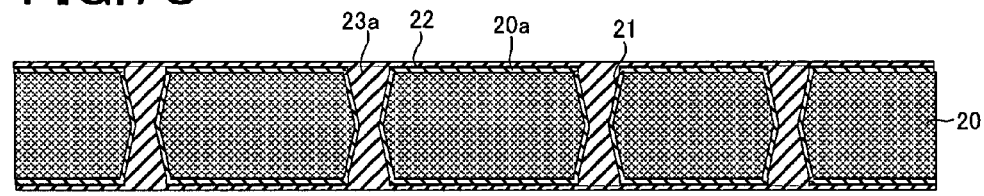
FIG. 7C is a view illustrating a step in the method for manufacturing a wiring board shown in FIG. 6.

As shown in FIG. 7C, core substrate 20 is immersed in an electroless plating solution to form electroless plated film 22 on first surface (F1) and second surface (F2) of core substrate 20 as well as on the inner walls of penetrating holes 21. Copper, nickel or the like may be used as the material for forming electroless plated film 22. Using electroless plated film 22 as a seed layer, electrolytic plated film (23a) is formed on electroless plated film 22. Penetrating holes 21 are filled with electrolytic plated film (23a).

Figure 7D:
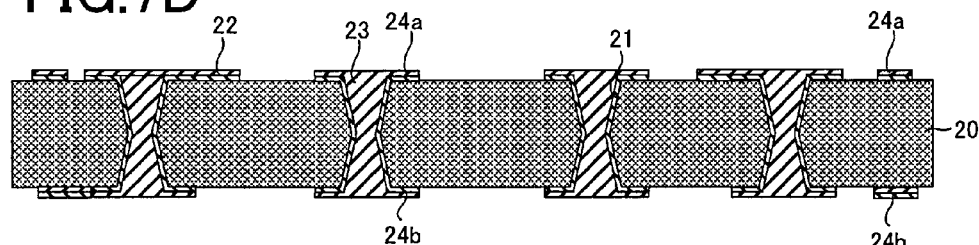
FIG. 7D is a view illustrating a step in the method for manufacturing a wiring board shown in FIG. 6.

As shown in FIG. 7D, etching resist with a predetermined pattern is formed on electrolytic plated film (23a) on substrate surfaces. Then, portions are removed from electroless plated film 22, electrolytic plated film (23a) and copper foil (20a) where no etching resist is formed. Then, by removing the etching resist, conductive layer (first conductor) (24a) is formed on first surface (F2) of core substrate 20 and conductive layer (second conductor) (24b) is formed on second surface (F2) of core substrate 20. Conductive layers (24a, 24b) are electrically connected to each other by via conductors 23 made of electrolytic plated film (23a) in penetrating holes 21.

Figure 7E:
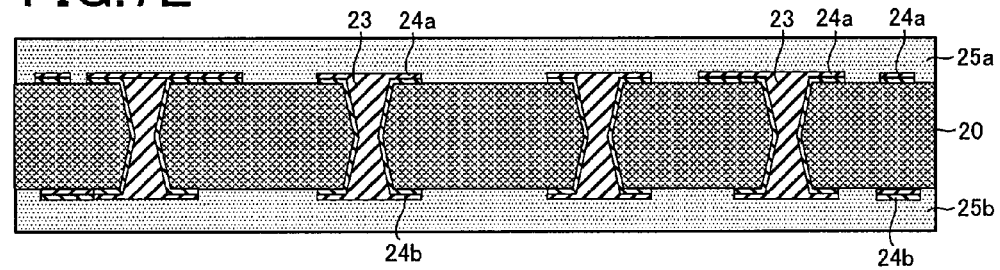
FIG. 7E is a view illustrating a step in the method for manufacturing a wiring board shown in FIG. 6.

In step (S23) of FIG. 6, interlayer insulation film (brand name: ABF-45SH, made by Ajinomoto), for example, is laminated on both surfaces (F1,F2)) of core substrate 20 to form interlayer insulation layers (25a, 25b) as shown in FIG. 7E.

Figure 7F:
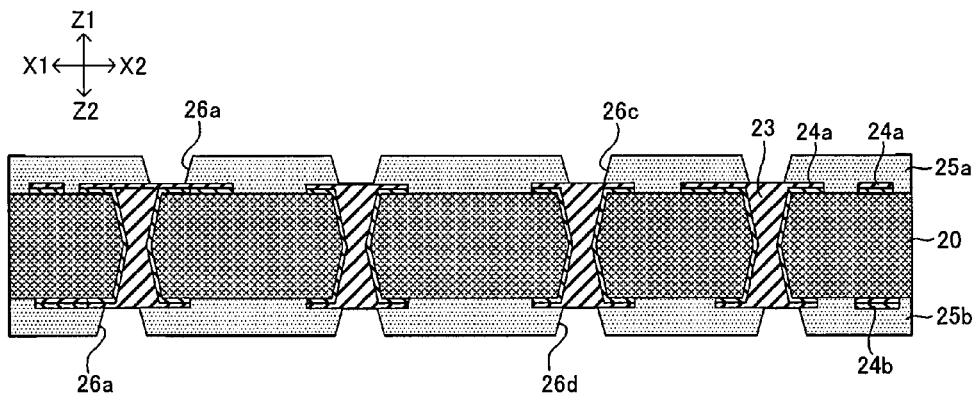
FIG. 7F is a view illustrating a step in the method for manufacturing a wiring board shown in FIG. 6.

As shown in FIG. 7F, using a CO$_2$ gas laser, via-hole opening portions (26c, 26d) are formed respectively in interlayer insulation layers (25a, 25b). Moreover, the substrate is immersed in an oxidation agent such as permanganate or the like to perform desmearing treatment.

Figure 7G:
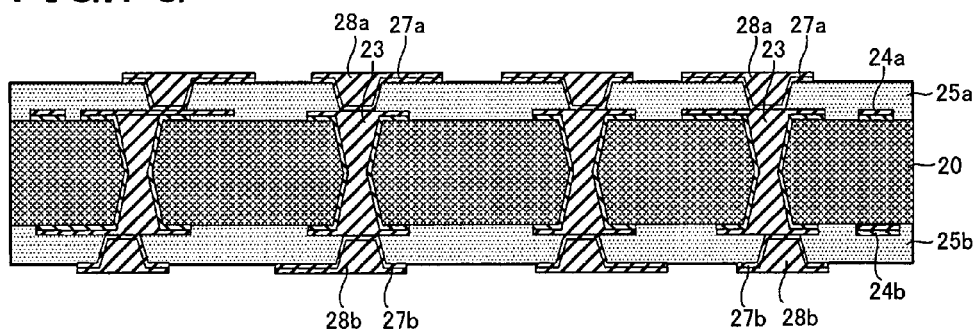
FIG. 7G is a view illustrating a step in the method for manufacturing a wiring board shown in FIG. 6.

Then, as shown in FIG. 7G, a catalyst such as palladium is attached to surfaces of interlayer insulation layers (25a, 25b) and the substrate is immersed in an electroless plating solution. Accordingly, electroless plated films (27a, 27b) are formed. After that, plating resist (not shown) is formed on electroless plated films (27a, 27b), and electrolytic plated films (28a, 28b) are formed on portions of electroless plated films (27a, 27b) exposed from the plating resist. Then, the plating resist is removed by using a solution containing monoethanolamine. Electroless plated film between portions of electrolytic plated film is removed by etching so that conductive layers (29a, 29b) and via conductors (30a, 30b) are formed. Next, Sn plating is performed on surfaces of conductive layers (29a, 29b) to form SnCu layers. A silane coupling agent is applied on the SnCu layers.

Figure 7H:
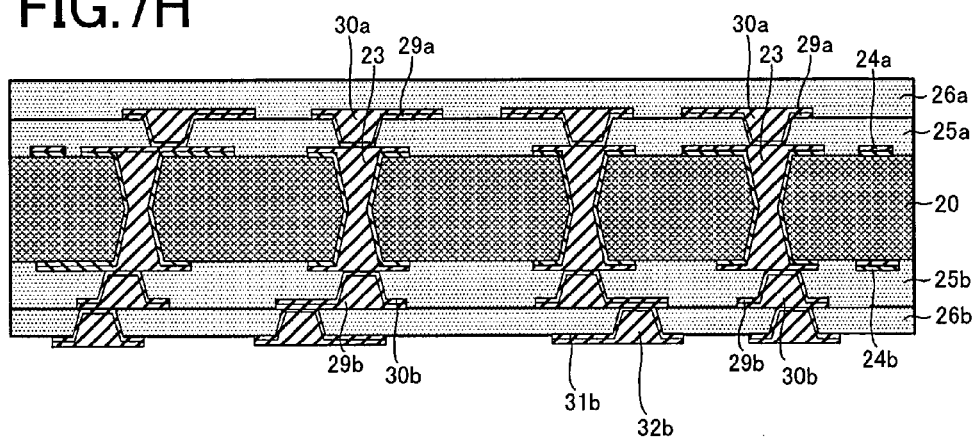
FIG. 7H is a view illustrating a step in the method for manufacturing a wiring board shown in FIG. 6.
Figure 7I:
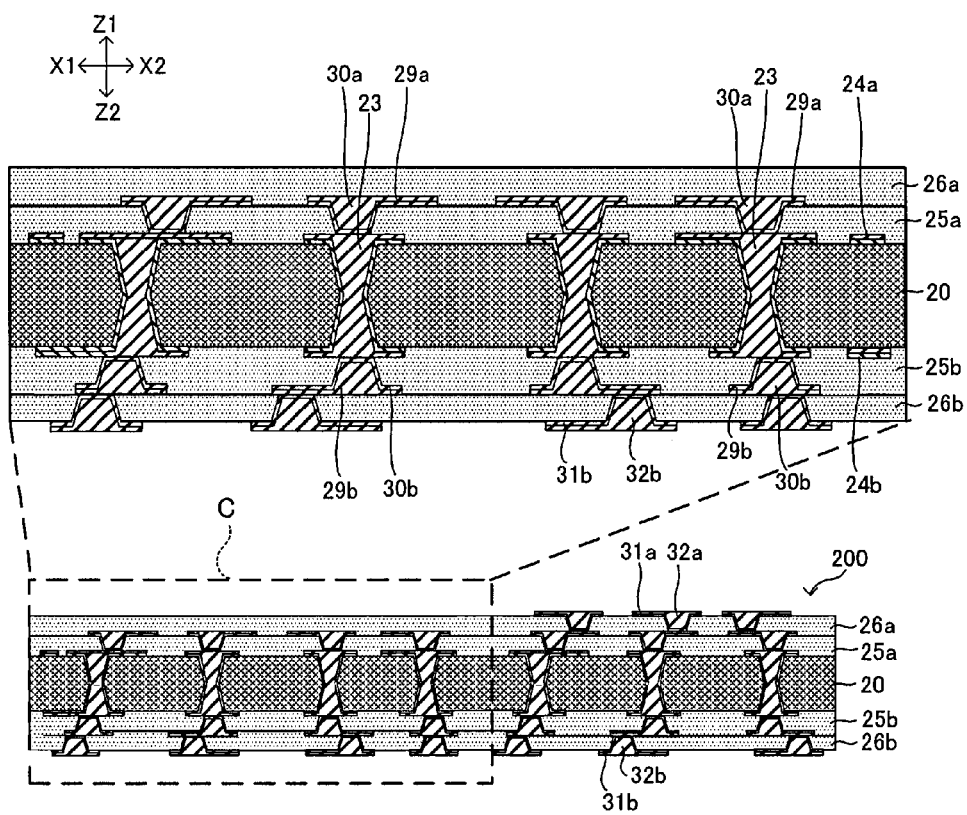
FIG. 7I is a view illustrating a step in the method for manufacturing a wiring board shown in FIG. 6 (the lower view is an enlarged cross section of region "C," which is a part of the upper view)
Figure 7J:
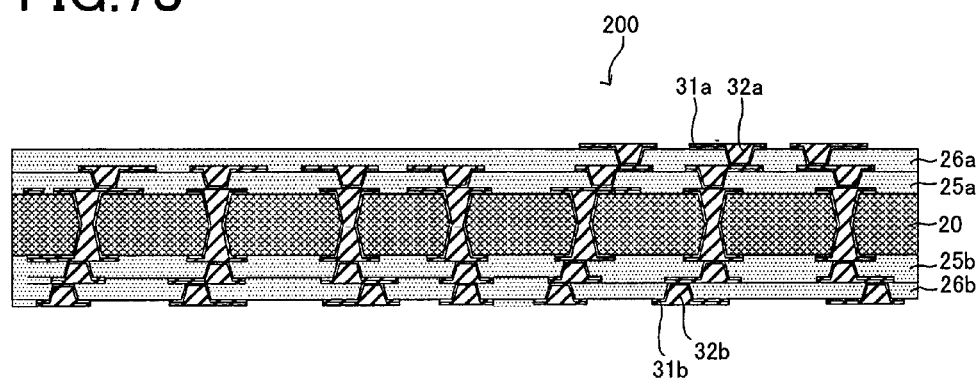
FIG. 7J is a view illustrating a step in the method for manufacturing a wiring board shown in FIG. 6.

In step (S24) of FIG. 6, the steps described above are repeated as shown in FIGS. 7H and 7I. Accordingly, on interlayer insulation layers (25a, 25b), interlayer insulation layers (26a, 26b) are laminated from the first-surface (F2) side and the second-surface (F2) side of core substrate 20, and conductive layers (31a, 31b) and via conductors (32a, 32b) are respectively formed on and in interlayer insulation layers (26a, 26b).

Figure 7K:
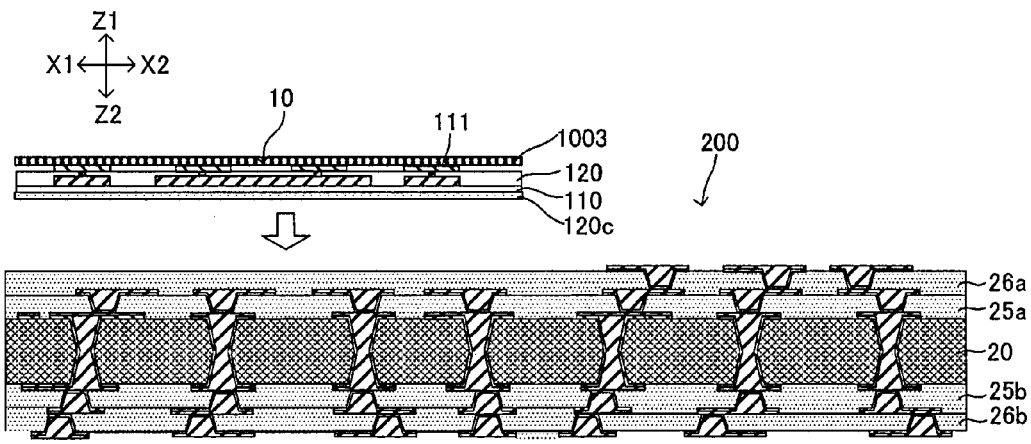
FIG. 7K is a view illustrating a step in the method for manufacturing a wiring board shown in FIG. 6.
Figure 7L:
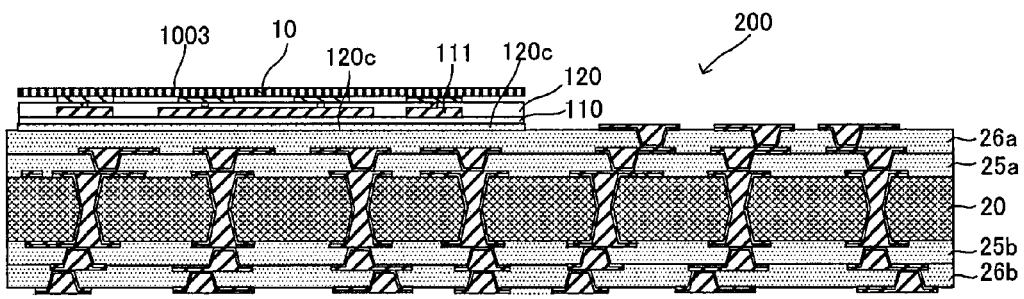
FIG. 7L is a view illustrating a step in the method for manufacturing a wiring board shown in FIG. 6.

In step (S25) of FIG. 6, wiring structure 10 is mounted on (adhered to) a predetermined region on interlayer insulation layers (26a) with adhesive layer (120c) disposed in between as shown in FIG. 7K. When wiring structure 10 is mounted on main wiring board 200, wiring structure 10 is shifted toward DRAM 51 (see FIG. 1B (b)). Subsequently, the substrate as shown in FIG. 7L is obtained.

Figure 7M:
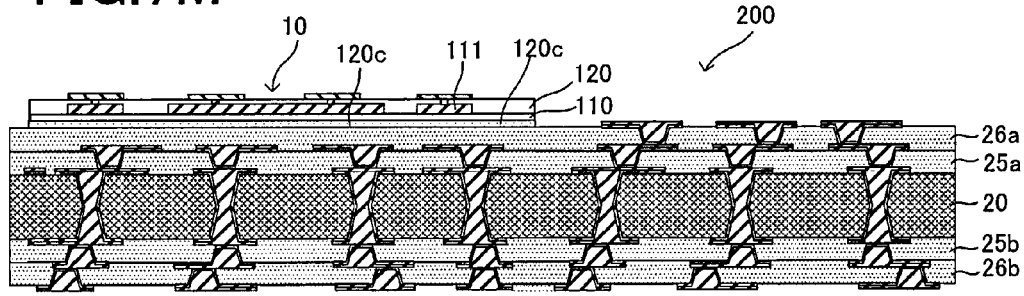
FIG. 7M is a view illustrating a step in the method for manufacturing a wiring board shown in FIG. 6.

Next, support plate 1003 is removed as shown in FIG. 7M.

Figure 7N:
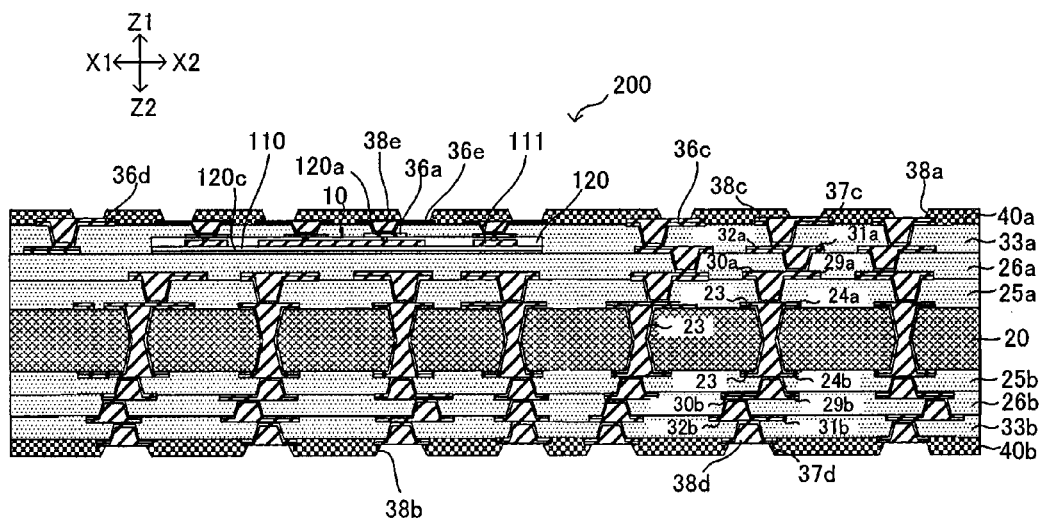
FIG. 7N is a view illustrating a step in the method for manufacturing a wiring board shown in FIG. 6.

Then, in step (S26) of FIG. 6, the above-described steps are repeated as shown in FIG. 7N. Accordingly, on interlayer insulation layers (26a, 26b), interlayer insulation layers (33a, 33b) are laminated from the first-surface (F2) side and the second-surface (F2) side of core substrate 20 (wiring board 100), and conductive layer (37*c*) (conductive pads (36*c*, 36*d*, 36*e*)), conductive layer (37*d*) and via conductors (38*c*, 38*d*) are respectively formed on and in interlayer insulation layers (33*a*, 33*b*).

Here, conductive pads (36*e*) above wiring structure 10 are formed to be set off from conductive pads (36*a*) toward MPU 50 and toward DRAM 51 based on the amount of positional shifting made by wiring structure 10 from the base mounting position shown in FIG. 1B (c) toward DRAM 51 when wiring structure 10 was mounted on main wiring board 200. Conductive pads (36*e*) closer to MPU 50 are formed to be set off from conductive pads (36*a*) toward MPU 50, and conductive pads (36*a*) closer to DRAM 51 are formed to be set off toward DRAM 51.

After that, referring to FIG. 7N, solder-resist layers (40*a*, 40*b*) are formed on both surfaces of the substrate by a conventional method, opening portions (38*a*, 38*b*) are respectively formed in solder-resist layers (40*a*, 40*b*) by photolithography in step (S27) of FIG. 6. Here, top surfaces of conductive pads (36*c*, 36*d*, 36*e*) exposed from solder resist layers (40*a*) through opening portions (38*a*) work as solder pads.

At that time, based on the amount of positional shifting made by wiring structure 10 from the base mounting position shown in FIG. 1B (c) toward DRAM 51 when wiring structure 10 was mounted on main wiring board 200, opening portions (38*a*) to expose conductive pads (36*e*) are formed to be set off from conductive pads (36*a*) toward MPU 50 and toward DRAM 51. Further, opening portions (38*a*) closer to MPU 50 are set off from conductive pads (36*a*) toward MPU 50, and opening portions (38*a*) closer to DRAM 51 are set off from conductive pads (36*a*) toward DRAM 51.

According to the present embodiment, by setting as described above, even if wiring structure 10 is shifted from the base mounting position shown in FIG. 1B (c) toward DRAM 51 as shown in FIG. 1B (b) during the mounting procedure on main wiring board 200, conductive pads (36*a*) of wiring structure 10 and conductive pads (50*a*, 51*a*) of MPU 50 and DRAM 51 are made sure to be connected. As a result, connection failure of conductive pads (50*a*, 51*a*) of MPU 50 and DRAM 51 to wiring structure 10 is reduced. Moreover, MPU 50 and DRAM 51 are mounted on wiring board 100 with a stable connection to wiring structure 10.

Also, in the present embodiment, conductive pad (36*c*) and opening portion (38*a*) to expose conductive pad (36*c*) are set off in direction (X2) from their designated base positions. Accordingly, even if DRAM 51 is shifted in direction (X2) (direction away from wiring structure 10), conductive pad (36*c*) of wiring board 100 and conductive pad (51*a*) of DRAM 51 are made sure to be connected.

Here, an example was described in which wiring structure 10 was shifted from the base mounting position shown in FIG. 1B (c) toward DRAM 51 as shown in FIG. 1B (b) when wiring structure 10 was mounted on main wiring board 200. However, it is not the only option, and the same applies when wiring structure 10 is shifted from the base mounting position shown in FIG. 1B (c) toward MPU 50; that is, based on the amount of positional shifting made by wiring structure 10 from the base mounting position shown in FIG. 1B (c) toward MPU 50 during the mounting procedure on main wiring board 200, conductive pads (36*e*) and opening portions (38*a*) to expose conductive pads (36*e*) are set off from conductive pads (36*a*) toward MPU 50 or toward DRAM 51. Accordingly, conductive pads (36*a*) of wiring structure 10 and conductive pads (50*a*, 51*a*) of MPU 50 and DRAM 51 are made sure to be connected.

Figure 7P:
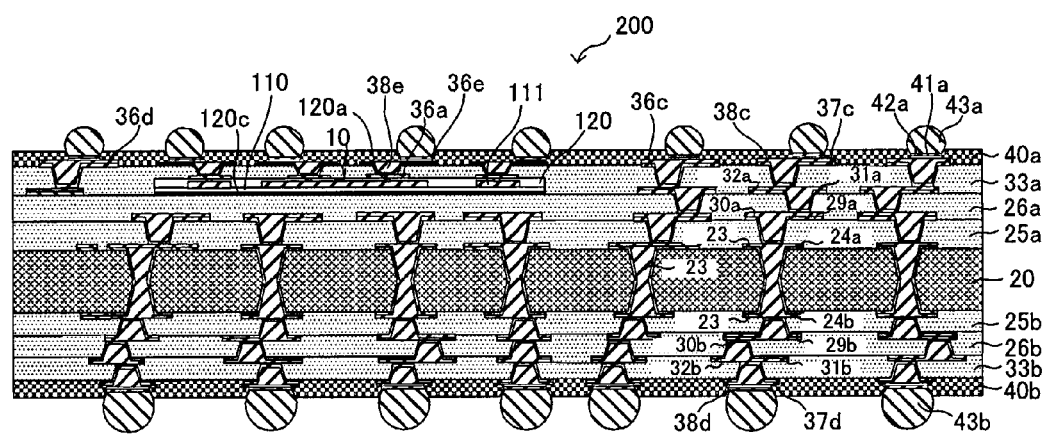
FIG. 7P is a view illustrating a step in the method for manufacturing a wiring board shown in FIG. 6.

Next, as shown in FIG. 7P, nickel-plated layers (41*a*, 41*b*) are formed on solder pads, and gold-plated layers (42*a*, 42*b*) are further formed on nickel-plated layers (41*a*, 41*b*). Instead of nickel-gold layers, nickel-palladium-gold layers may also be formed. After that, solder balls are loaded in opening portions (38*a*, 38*b*) and a reflow process is conducted. Accordingly, solder bumps (43*a*) are formed on the first-surface (upper-surface) side, and solder bumps (43*b*) are formed on the second-surface (lower-surface) side to complete wiring board 100 (see FIGS. 1A and 1C) as a multilayer printed wiring board.

In the above embodiment, wiring structure 10 was formed in interlayer insulation layer (33*a*) positioned as the first-surface (F2) side uppermost surface of wiring board 100, but it may also be formed in inner interlayer insulation layers (26*a*, 25*a*).

Second Embodiment

The above first embodiment was set under a condition that wiring structure 10 was shifted toward DRAM 51, and conductive pads (36*a*) of wiring structure 10 and conductive pads (50*a*, 51*a*) of MPU 50 and DRAM 51 were made sure to be connected by forming conductive pads (36*e*) positioned above wiring structure 10 to be set off from conductive pads (36*a*) toward MPU 50 and toward DRAM 51.

Figure 8A:
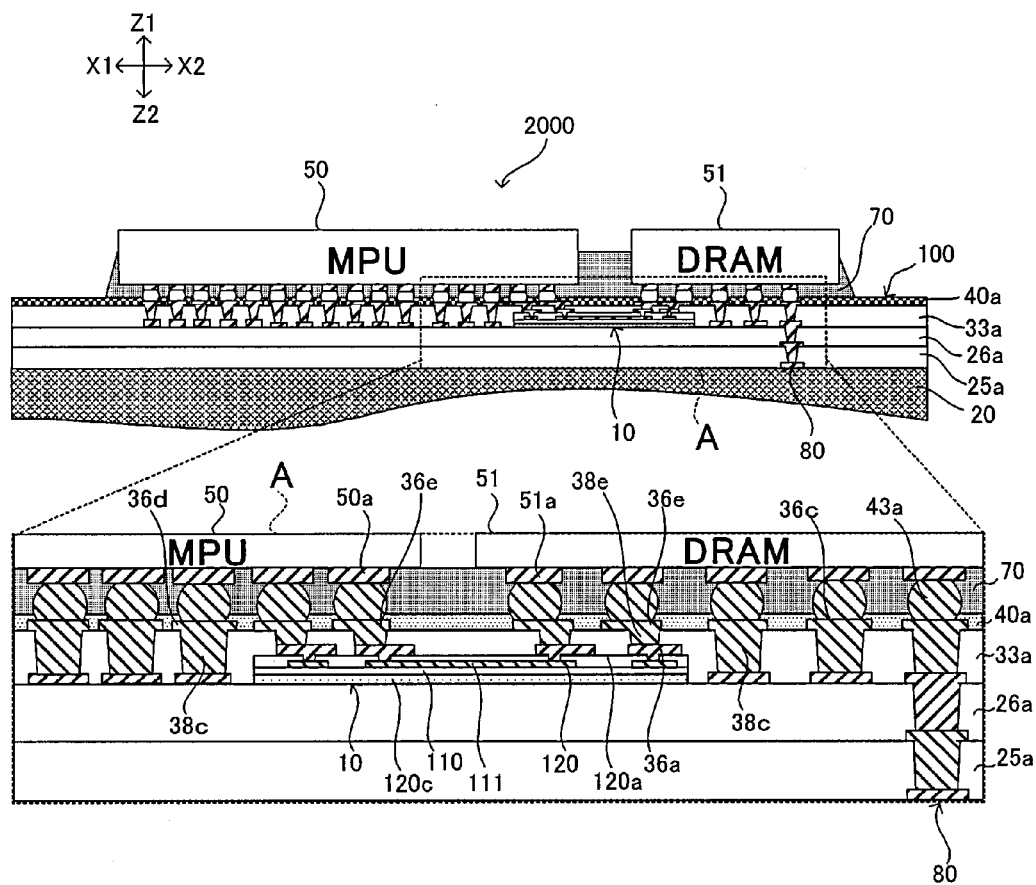
FIG. 8A is a cross-sectional view showing a package substrate where a wiring board according to a second embodiment of the present invention is used (the lower view is an enlarged cross section of region "A," which is a part of the upper view)
Figure 8B:
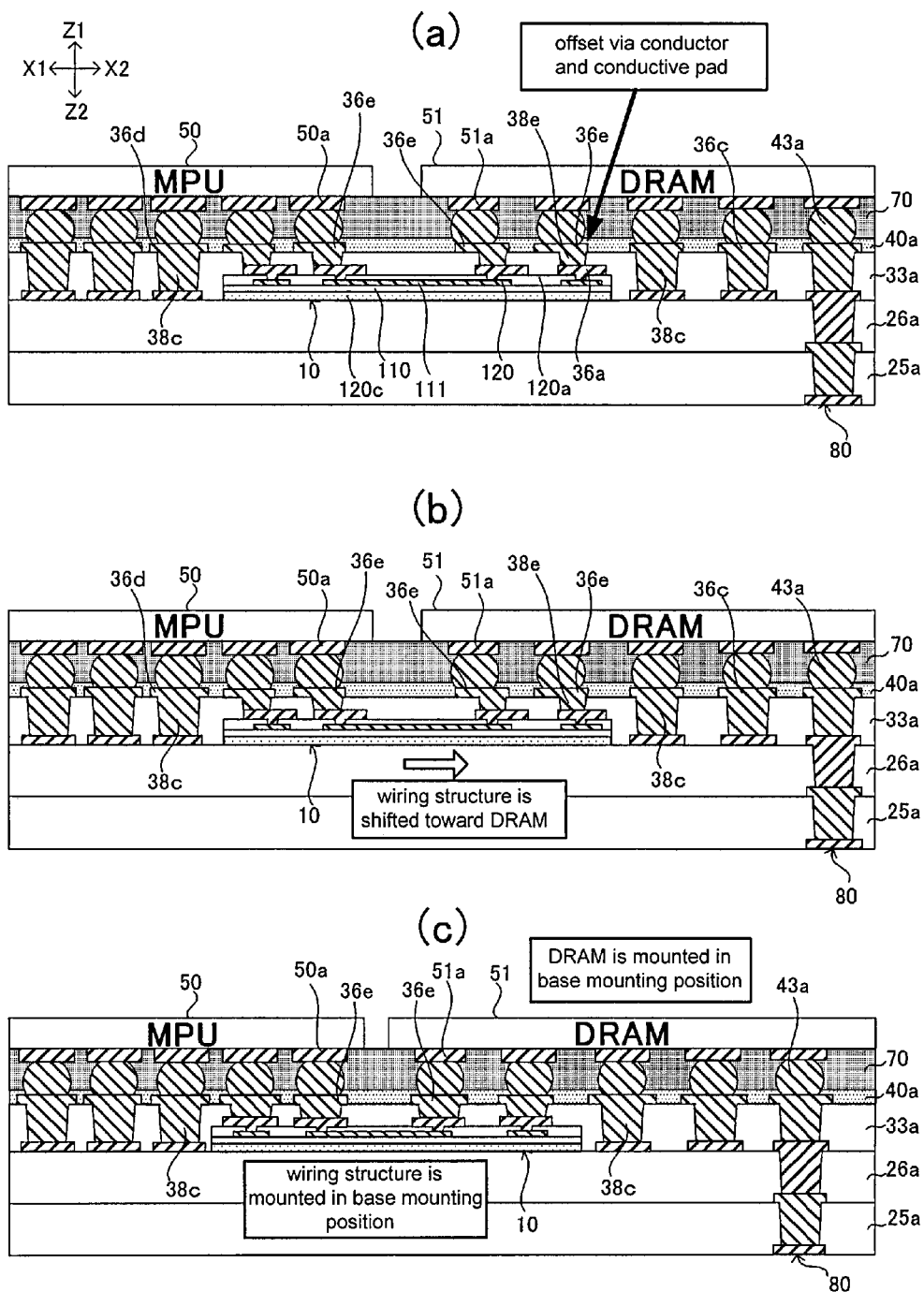
FIG. 8B(a) is a cross-sectional view showing in detail a wiring board of the second embodiment.

As shown in FIGS. 8A and 8B (b), the present embodiment is also set under a condition that wiring structure 10 is shifted toward DRAM 51. However, the present embodiment is different from the first embodiment; in addition to conductive pads (36*e*) positioned above wiring structure 10, via conductors (38*e*) each connecting conductive pad (36*e*) and conductive pad (36*a*) are also set off from conductive pads (36*a*) toward MPU 50 and toward DRAM 51.

Thus, when wiring structure 10 is mounted on main wiring board 200, even if wiring structure 10 is shifted from the base mounting position shown in FIG. 8B (c) toward DRAM 51 even more significantly than the amount shown in FIG. 1B (b), conductive pads (36*a*) of wiring structure 10 and conductive pads (50*a*, 51*a*) of MPU 50 and DRAM 51 are made sure to be connected.

According to the present embodiment, since not only conductive pads (36*e*) but also via conductors (38*e*) are set off from conductive pads (36*a*) toward MPU 50 and toward DRAM 51, even if a significant amount of positional shifting occurs during mounting procedures of wiring structure 10, conductive pads (36*a*) of wiring structure 10 and conductive pads (50*a*, 51*a*) of MPU 50 and DRAM 51 are made sure to be connected.

The same as in the first embodiment, the present embodiment is not limited to a condition when wiring structure 10 is shifted toward DRAM 51, but is also applicable when wiring structure 10 is shifted toward MPU 50.

Also, in the present embodiment, conductive pads (36*c*, 36*d*, 36*e*) (conductive layer 37*c*) and via conductors (38*e*) are formed at the same time by a printing method or by inkjet when conductive pads (36*c*, 36*d*, 36*e*) (conductive layer 37*c*) and via conductors (38*e*) are formed in a processing step for manufacturing wiring board 100 shown in FIG. 7N.

In the present embodiment as well, only signal transmission lines are present in wiring structure 10, and no power-supply line is provided. Power is supplied to MPU 50 and DRAM 51 through stacked vias 80 formed in main wiring board 200 as shown in FIG. 8A.

In the present embodiment, since the structure and functions other than those mentioned above are the same as in the first embodiment, their detailed descriptions are omitted by applying the same reference numerals to the corresponding portions. Also, since wiring board 100 is manufactured the same as in the first embodiment except that not only conductive pads (36*e*) but also via conductors (38*e*) are set off from conductive pads (36*a*) toward MPU 50 and toward DRAM 51 in the present embodiment, the detailed description of the method for manufacturing wiring board 100 is omitted. In addition, the method for manufacturing wiring structure 10 is also omitted since it is the same as in the first embodiment.

Third Embodiment

In the second embodiment, wiring structure 10 was set to be shifted toward DRAM 51. Thus, by forming conductive pads (36*e*) and via conductors (38*e*) positioned above wiring structure 10 to be set off from conductive pads (36*a*) toward MPU 50 and toward DRAM 51, conductive pads (36*a*) of wiring structure 10 and conductive pads (50*a*, 51*a*) of MPU 50 and DRAM 51 were made sure to be connected.

Figure 9A:
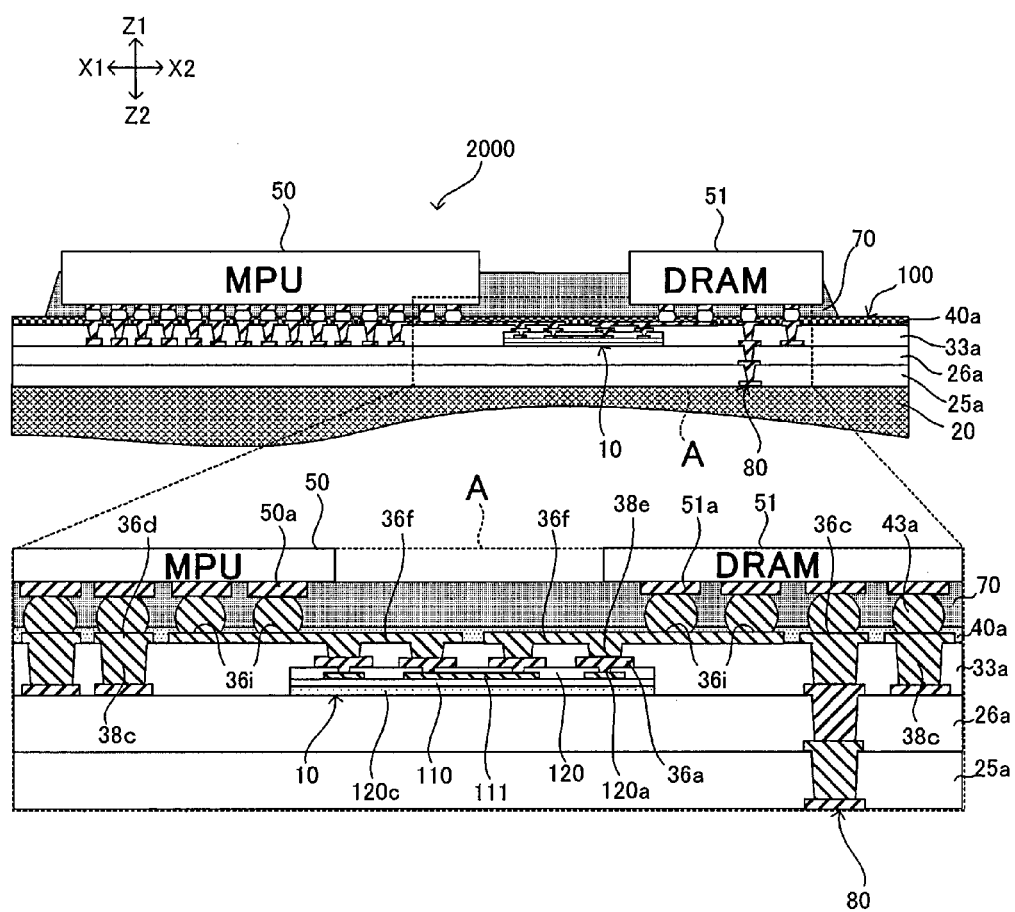
FIG. 9A is a cross-sectional view showing a package substrate where a wiring board according to a third embodiment of the present invention is used (the lower view is an enlarged cross section of region "A," which is a part of the upper view)
Figure 9B:
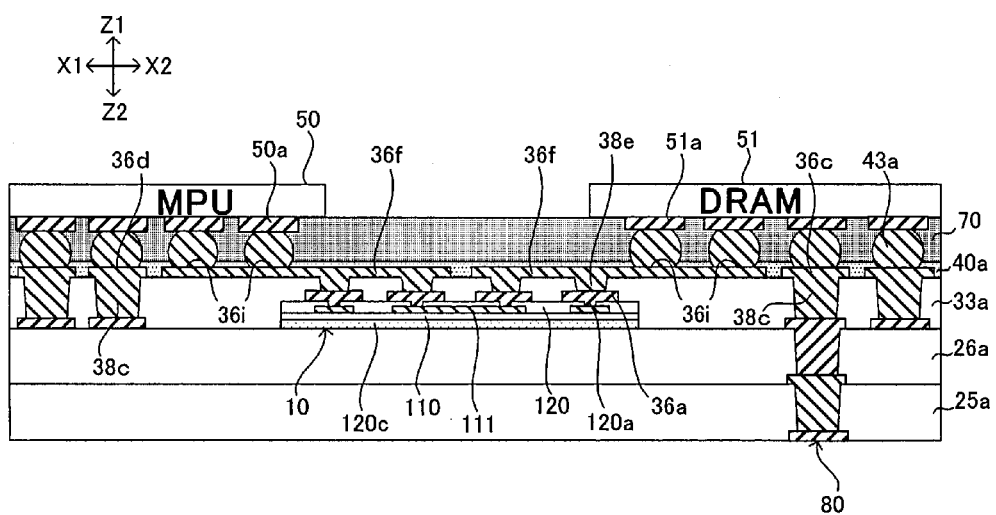
FIG. 9B is a cross-sectional view showing in detail the wiring board according to the third embodiment.

The present embodiment is set under a condition that wiring structure 10 is shifted toward DRAM 51 or MPU 50. In the present embodiment, as shown in FIGS. 9A and 9B, on interlayer insulation layer (33*a*) above wiring structure 10, wiring patterns (36*f*) are formed to be connected to conductive pads (36*a*) while being extended toward MPU 50 and toward DRAM 51. Then, conductive pads (36*a*) of wiring structure 10 and conductive pads (50*a*, 51*a*) of MPU 50 and DRAM 51 are electrically connected through wiring patterns (36*f*). Accordingly, even if wiring structure 10 is shifted toward DRAM 51 or MPU 50, conductive pads (36*a*) of wiring structure 10 and conductive pads (50*a*, 51*a*) of MPU 50 and DRAM 51 are made sure to be connected.

In the present embodiment, conductive pads (50*a*, 51*a*) of MPU 50 and DRAM 51 are connected through solder bumps (43*a*) to the pads formed on wiring patterns (36*f*) and exposed from opening portions (38*a*) of solder-resist layer (40*a*).

DRAM 51 and MPU 50 are separated by a longer distance than the distance shown in FIG. 1A of the first embodiment and FIG. 8A of the second embodiment. According to the present embodiment, even if the distance separating DRAM 51 and MPU 50 is long, conductive pads (36*a*) of wiring structure 10 and conductive pads (50*a*, 51*a*) of MPU 50 and DRAM 51 are made sure to be connected by wiring patterns (36*f*) having a long distribution distance.

Furthermore, according to the present embodiment, even if wiring structure 10 is shifted from the base mounting position shown in FIG. 9B (c) toward DRAM 51 during mounting procedures on main wiring board 200 more significantly than the conditions shown in FIG. 1B (b) and FIG. 8B (b), conductive pads (36*a*) of wiring structure 10 and conductive pads (50*a*, 51*a*) of MPU 50 and DRAM 51 are made sure to be connected by wiring patterns (36*f*) and conductive pads (36*i*), which are formed on wiring patterns (36*0* for mounting MPU 50 and DRAM 51.

In the present embodiment, instead of forming conductive pads (36*c*, 36*d*, 36*e*) in conductive layer (37*c*), wiring patterns (36*0* for wiring distribution are formed to extend toward MPU 50 and toward DRAM 51 in a step for processing wiring board 100 shown in FIG. 7N. Here, wiring patterns (36*0* (conductive layer 37*c*) and via conductors (38*e*) are formed in a single procedure by a printing method or by inkjet.

In the present embodiment as well, only signal transmission lines are present in wiring structure 10 and no power-source line is provided. Power to MPU 50 and DRAM 51 is supplied through stacked vias 80 formed in main wiring board 200 as shown in FIG. 9A.

In the present embodiment, since the structure and functions other than those mentioned above are the same as in the first embodiment, their detailed descriptions are omitted by applying the same reference numerals to the corresponding portions. Also, wiring board 100 is manufactured the same as in the first and second embodiments except that wiring patterns (36*0* for wiring distribution extending toward MPU 50 and toward DRAM 51 are formed in conductive layer (37*c*) to replace conductive pads (36*c*, 36*d*, 36*e*). In addition, the method for manufacturing wiring structure 10 is the same as in the first embodiment.

The embodiment above can be modified within a scope that does not deviate from the technological concept of the present invention. A modified example of the present embodiment is described below.

Modified Example

Figure 10:
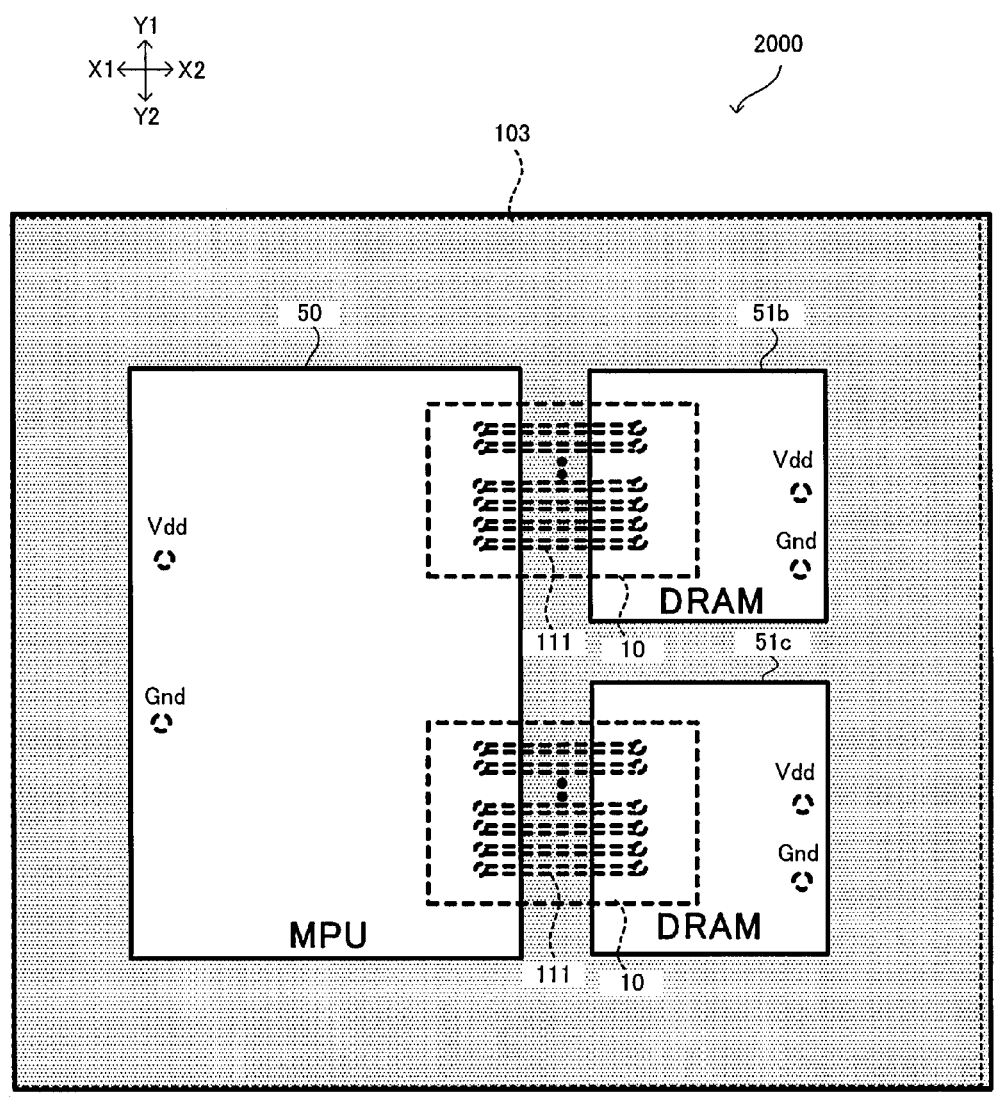
FIG. 10 is a plan view showing a wiring board according to a modified example of an embodiment of the present invention.

In the above embodiments, MPU 50 and DRAM 51 were connected by one wiring structure 10. By contrast, in the present modified example, two (multiple) wiring structures 10 are used in wiring board 103 as shown in FIG. 10, and MPU 50 and two DRAMs (51*b*, 51*c*) are connected by those wiring structures 10. The rest is the same as the above embodiments, and its detailed description is omitted here by applying the same reference numerals to the corresponding portions.

Compared with an example where only a single wiring structure 10 is used, electrical connection reliability is enhanced between MPU 50 and two DRAMs (51*b*, 51*c*) by employing the above-described connection method. Namely, wiring structures 10 exclusively corresponding to the characteristics of DRAMs (51*b*, 51*c*) (wiring pitch, wiring width or the like) respectively may be used, for example, thereby enhancing the accuracy of electrical connection. As a result, DRAMs (51*b*, 51*c*) connected to MPU 50 can achieve maximum performance.

So far, wiring boards and their manufacturing processes according to embodiments of the present invention have been described. However, a wiring board and its manufacturing process related to the present invention are not limited to the orders and contents shown in each of the above embodiments and modified examples. The orders and contents may be freely modified within a scope that does not deviate from the gist of the present invention. Also, any unnecessary step may be omitted depending on usage purposes or the like.

Any combination is possible for each of the above embodiments and modified examples. An appropriate combination may be selected depending on usage purposes or the like.

As a multilayer printed wiring board for mounting an IC chip (semiconductor element), a wiring board may have an interlayer insulation layer and a conductive layer alternately laminated on a resin core substrate and have through-hole conductors, and the conductive layers may be connected to each other by via-hole conductors.

In recent years, IC chips have become finer and more highly integrated, thus resulting in an increase in the number of mounting pads formed on the uppermost layer of a package substrate. As the number of mounting pads increases, they are formed at a finer pitch. In response to the finer pitch of mounting pads, the wiring pitch of a package substrate is rapidly becoming finer.

High-density wiring may be formed in part of the interior of the wiring board. More specifically, an electronic component with high-density wiring may be provided inside an interlayer insulation layer of the wiring board. Such a structure responds to the above-described finer pitch of mounting pads.

To provide a thin electronic component in an interlayer insulation layer, positional shifting tends to occur. If an electronic component is provided in a portion shifted from a predetermined position, proper connection may not be ensured between the electronic component and a semiconductor element to be mounted on the wiring board (package substrate). Also, since pads for the semiconductor element are customized, a generic semiconductor element may not be used in a method for separating an electronic component and wiring pads formed on the wiring board (package substrate).

A wiring board according to an embodiment of the present invention is capable of mounting a semiconductor element at high yield.

A wiring board according to an embodiment of the present invention has the following: a first insulation layer; first conductive patterns which are formed on the first insulation layer and which include first mounting pads for mounting one or more semiconductor elements; a wiring structure which is provided in the first insulation layer and which has a second insulation layer, second conductive patterns formed on the second insulation layer, and second mounting pads connected to the second conductive patterns; and third mounting pads for mounting the semiconductor element which are connected to the second mounting pads and formed further on an upper layer than the second mounting pads.

In such a wiring board, the third mounting pads are set off from the second mounting pads toward the semiconductor element, and the first mounting pads are set off from their base positions.

The size of a third mounting pad is preferred to be longer than a basic size required for mounting a semiconductor element.

A wiring board according to another embodiment of the present invention has the following: a first insulation layer; first conductive patterns which are formed on the first insulation layer and which include first mounting pads for mounting one or more semiconductor elements; a wiring structure which is provided in the first insulation layer and which has a second insulation layer, second conductive patterns formed on the second insulation layer, and second mounting pads connected to the second conductive patterns; and third mounting pads for mounting the semiconductor element which are connected to the second mounting pads and formed further on an upper layer than the second mounting pads.

In such a wiring board, the third mounting pads are set off from the second mounting pads toward the semiconductor element, and the first mounting pads are formed in their base positions.

A wiring board according to another embodiment of the present invention has the following: a first insulation layer; first conductive patterns which are formed on the first insulation layer and which include first mounting pads for mounting one or more semiconductor elements; and a wiring structure which is provided in the first insulation layer and which has a second insulation layer, second conductive patterns formed on the second insulation layer, and second mounting pads connected to the second conductive patterns.

In such a wiring board, the second mounting pads are connected to fourth mounting pads which are formed on a further upper layer than the second mounting pads and which are for mounting the semiconductor element through wiring patterns extended toward the semiconductor element.

The second conductive patterns are preferred to be signal lines to connect a first semiconductor element as one of the semiconductor elements and a second semiconductor element as another one of the semiconductor elements.

The pattern width of the second conductive patterns is preferred to be shorter than the pattern width of the first conductive patterns.

The distance between the adjacent second conductive patterns is preferred to be shorter than the distance between the adjacent first conductive patterns.

An adhesive layer is preferred to be disposed between the wiring structure and an insulation layer lower than the first insulation layer.

The third mounting pads are preferred to include first pads connected to a first semiconductor element as one of the semiconductor elements and second pads connected to a second semiconductor element as another one of the semiconductor elements, and the distance between the first pads is preferred to be shorter than the distance between the second pads.

The first semiconductor element is preferred to be a microprocessor and the second semiconductor element is preferred to be a dynamic RAM.

The L/S (line and space) of the second conductive patterns is preferred to be 1 µm/1 µm to 5 µm/5 µm.

A method for manufacturing a wiring board according to another embodiment of the present invention includes the following: on a first insulation layer, forming first conductive patterns including first mounting pads for mounting one or more semiconductor elements; in the first insulation layer, providing a wiring structure having a second insulation layer, second conductive patterns formed on the second insulation layer, and second mounting pads connected to the second conductive patterns; and on a further upper layer than the second mounting pads, forming third mounting pads which are connected to the second mounting pads and are for mounting the semiconductor element.

In such a method, the third mounting pads are set off from the second mounting pads toward the semiconductor element, while the first mounting pads are set off toward the wiring structure.

A method for manufacturing a wiring board according to yet another embodiment of the present invention includes the following: on a first insulation layer, forming first conductive patterns including first mounting pads for mounting one or more semiconductor elements; in the first insulation layer, providing a wiring structure having a second insulation layer, second conductive patterns formed on the second insulation layer, and second mounting pads connected to the second conductive patterns; and on a further upper layer than the second mounting pads, forming third mounting pads which are connected to the second mounting pads and are for mounting the semiconductor element.

In such a method, the third mounting pads are set off from the second mounting pads toward the semiconductor element, while the first mounting pads are formed in base positions.

A method for manufacturing a wiring board according to still another embodiment of the present invention includes the following: on a first insulation layer, forming first conductive patterns including first mounting pads for mounting one or more semiconductor elements; in the first insulation layer, providing a wiring structure having a second insulation layer, second conductive patterns formed on the second insulation layer, and second mounting pads connected to the second conductive patterns; on a further upper layer than the second mounting pads, forming wiring patterns extending toward the semiconductor element; and on a further upper layer than the second mounting pads, forming fourth mounting pads which are connected to the wiring patterns and are for mounting the semiconductor element.

In such a manufacturing method, the second mounting pads are connected to the fourth mounting pads through the wiring patterns.

The wiring patterns are preferred to be formed by a printing method or by inkjet.

According to an embodiment of the present invention, a highly reliable wiring board is provided.

A wiring board according to an embodiment of the present invention is suitable for use as a package substrate on which multiple semiconductor elements (dies) are to be mounted. Also, a method for manufacturing a wiring board according to an embodiment of the present invention is suitable for manufacturing a package substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a first insulation layer;
   a plurality of first conductive patterns formed on the first insulation layer and including a plurality of first mounting pads positioned to mount a first semiconductor element and a second semiconductor element on the first insulation layer;
   a wiring structure positioned in the first insulation layer and comprising a second insulation layer, a plurality of second conductive patterns formed on the second insulation layer, and a plurality of second mounting pads connected to the second conductive patterns; and
   a plurality of third mounting pads formed on the first insulation layer above the second mounting pads and connected to the second mounting pads, the plurality of third mounting pads is positioned to mount the first semiconductor element and the second semiconductor element on the first insulation layer such that a plurality of first pads of the third mounting pads is shifted away from the plurality of second mounting pads in a horizontal direction perpendicular to a lamination direction and positioned to face a plurality of conductive pads of the first semiconductor element, respectively, and a plurality of second pads of the third mounting pads is shifted away from the plurality of second mounting pads in the horizontal direction and positioned to face a plurality of conductive pads of the second semiconductor element, respectively.

2. A wiring board according to claim 1, further comprising:
   a plurality of via conductors formed in the first insulation layer and connected to the plurality of first mounting pads,
   wherein the plurality of first mounting pads is positioned such that the first mounting pads are shifted away from positions of the via conductors, respectively.

3. A wiring board according to claim 1, wherein each of the third mounting pads has a size which is longer than a pad size required for mounting the first semiconductor element.

4. A wiring board according to claim 1, further comprising:
   a plurality of via conductors formed in the first insulation layer and connected to the plurality of first mounting pads,
   wherein the plurality of first mounting pads is positioned such that the first mounting pads are formed in positions of the via conductors respectively.

5. A wiring board according to claim 1, further comprising:
   a wiring pattern structure formed on the first insulation layer and extending toward the first semiconductor element such that the wiring pattern structure is connecting the second mounting pads and the third mounting pads.

6. A wiring board according to claim 1, wherein the plurality of second conductive patterns forms a plurality of signal lines which connects the first semiconductor element and the second semiconductor element.

7. A wiring board according to claim 1, wherein the plurality of second conductive patterns has a pattern width which is smaller than a pattern width of the plurality of first conductive patterns.

8. A wiring board according to claim 1, wherein the plurality of second conductive patterns forms a distance between adjacent second conductive patterns which is smaller than a distance between adjacent first conductive patterns of the plurality of first conductive patterns.

9. A wiring board according to claim 1, further comprising:
   a lower insulation layer; and
   an adhesive layer formed between the wiring structure and the lower insulation layer,
   wherein the wiring structure and the first insulation layer are formed on the lower insulation layer.

10. A wiring board according to claim 1, wherein the plurality of first pads has a distance between adjacent first pads which is smaller than a distance between adjacent second pads of the plurality of second pads.

11. A wiring board according to claim 1, wherein the first semiconductor element is a microprocessor, and the second semiconductor element is a dynamic RAM.

12. A wiring board according to claim 1, wherein the plurality of second conductive patterns has a line and space, L/S, in a range of 1 µm/1 µm to 5 µm/5 µm.

13. A method for manufacturing a wiring board, comprising:
   forming a wiring structure comprising a second insulation layer, a plurality of second conductive patterns formed on the second insulation layer, and a plurality of second mounting pads connected to the second conductive patterns;
   accommodating the wiring structure in a first insulation layer such that the wiring structure is positioned in the first insulation layer;
   forming on the first insulation layer a plurality of first conductive patterns including a plurality of first mounting pads such that the plurality of first mounting pads is positioned to mount a first semiconductor element and a second semiconductor element on the first insulation layer; and
   forming a plurality of third mounting pads on the first insulation layer above the second mounting pads such that the plurality of third mounting pads is connected to the second mounting pads and positioned to mount the first semiconductor element and the second semiconductor element on the first insulation layer,
   wherein the forming of the third mounting pads includes forming the plurality of third mounting pads such that the third mounting pads includes a plurality of first pads shifted away from the second mounting pads in a horizontal direction perpendicular to a lamination direction and positioned to face a plurality of conductive pads of the first semiconductor element, respectively, and a plurality of second pads shifted away from the second mounting pads in the horizontal direction and positioned to face a plurality of conductive pads of the second semiconductor element, respectively.

14. A method for manufacturing a wiring board according to claim 13, further comprising:
forming a plurality of via conductors in the first insulation layer,
wherein the forming of the first conductive patterns includes positioning the plurality of first mounting pads such that the first mounting pads are shifted away from positions of the via conductors, respectively.

15. A wiring board according to claim 14, wherein the forming of the third mounting pads includes forming the third mounting pads such that each of the third mounting pads has a size which is longer than a pad size required for mounting the first semiconductor element.

16. A method for manufacturing a wiring board according to claim 13, further comprising:
forming a plurality of via conductors in the first insulation layer,
wherein the forming of the first conductive patterns includes positioning the plurality of first mounting pads such that the first mounting pads are formed in positions of the via conductors respectively.

17. A method for manufacturing a wiring board according to claim 13, further comprising:
forming a wiring pattern structure on the first insulation layer such that the wiring pattern structure extends toward the first semiconductor element and connects the second mounting pads and the third mounting pads.

18. A method for manufacturing a wiring board according to claim 17, wherein the forming of the wiring pattern structure includes forming the wiring structure by a printing method.

19. A method for manufacturing a wiring board according to claim 17, wherein the forming of the wiring pattern structure includes printing the wiring structure by inkjet.

20. A method for manufacturing a wiring board according to claim 13, wherein the accommodating of the wiring structure includes positioning the wiring structure on a lower insulation layer and laminating the first insulation layer on the lower insulation layer such that the wiring structure on the lower insulation layer is accommodated in the first insulation layer.

* * * * *